(12) United States Patent
Tanimoto et al.

(10) Patent No.: US 8,653,827 B2
(45) Date of Patent: Feb. 18, 2014

(54) ACTIVE MATRIX SUBSTRATE, DISPLAY DEVICE, METHOD FOR INSPECTING ACTIVE MATRIX SUBSTRATE, AND METHOD FOR INSPECTING DISPLAY DEVICE

(75) Inventors: Kazunori Tanimoto, Osaka (JP); Isao Ogasawara, Osaka (JP); Masahiro Yoshida, Osaka (JP); Takehiko Kawamura, Osaka (JP); Hideaki Takizawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 677 days.

(21) Appl. No.: 12/920,857

(22) PCT Filed: Mar. 13, 2009

(86) PCT No.: PCT/JP2009/054898
§ 371 (c)(1),
(2), (4) Date: Sep. 3, 2010

(87) PCT Pub. No.: WO2009/113669
PCT Pub. Date: Sep. 17, 2009

(65) Prior Publication Data
US 2011/0006780 A1    Jan. 13, 2011

(30) Foreign Application Priority Data

Mar. 14, 2008   (JP) ................................ 2008-066479

(51) Int. Cl.
*G01R 31/04* (2006.01)
(52) U.S. Cl.
CPC .................................... *G01R 31/045* (2013.01)
USPC ....................................................... 324/538
(58) Field of Classification Search
None
See application file for complete search history.

(56) References Cited

U.S. PATENT DOCUMENTS

| 7,884,892 B2 * | 2/2011 | Ishii ................................ 349/54 |
| 2003/0063248 A1 | 4/2003 | Komeno et al. |
| 2010/0006838 A1 | 1/2010 | Yoshida et al. |

FOREIGN PATENT DOCUMENTS

| JP | 8-262485 A | 10/1996 |
| JP | 9-329796 A | 12/1997 |
| JP | 2002-98992 A | 4/2002 |
| JP | 2003-172944 A | 6/2003 |
| JP | 2003-241217 A | 8/2003 |
| JP | 2004-226931 A | 8/2004 |
| JP | 2004-325956 A | 11/2004 |
| JP | 2005-241988 A | 9/2005 |
| JP | 2005-266529 A | 9/2005 |
| JP | 2005-301308 A | 10/2005 |
| WO | WO2008/015808 A1 | 2/2008 |

* cited by examiner

*Primary Examiner* — Paresh Patel
(74) *Attorney, Agent, or Firm* — Birch, Stewart, Kolasch & Birch, LLP

(57) ABSTRACT

Provided is an active matrix substrate having improved display quality without forming an inspection line in a terminal arrangement region for inspecting short circuit between connection lines. Scanning lines (40) include first scanning lines having input ends for a scanning signal on one end side, and second scanning lines having input ends for a scanning signal the other end side. In a display region (4), the first scanning lines and the second scanning lines are formed alternately one by one. An active matrix substrate (2) includes a first inspection line (70) and a second inspection line (72) that cross each of a plurality of first connection lines (61), and a third inspection line (75) and a fourth inspection line (77) that cross each of a plurality of second connection lines (64). The first to the fourth inspection lines (70, 72, 75, 77) are formed in a frame-shaped wiring region (6), excluding the terminal arrangement region (5) and the display region (4).

20 Claims, 16 Drawing Sheets

ACTIVE MATRIX SUBSTRATE, DISPLAY DEVICE, METHOD FOR INSPECTING ACTIVE MATRIX SUBSTRATE, AND METHOD FOR INSPECTING DISPLAY DEVICE

TECHNICAL FIELD

The present invention relates to an active matrix substrate in which a plurality of first scanning lines having input ends for a scanning signal on one end side and a plurality of second scanning lines having input ends for a scanning signal on the other end side are formed parallel and alternate with one another one by one, and a plurality of data lines cross the plurality of first scanning lines and the plurality of second scanning lines and are formed parallel with each other in a display region; a display device; a method for inspecting an active matrix substrate; and a method for inspecting a display device.

BACKGROUND ART

Recently, liquid crystal panels have been used widely in various electronic equipment such as mobile telephones, PDAs, car navigation systems, personal computers, televisions, video cameras, and digital cameras. Liquid crystal panels have advantages of thinness, lightweight, and low-power consumption. As for methods of mounting drivers on such liquid crystal panels, a so-called COG (Chip On Glass) method has been known in which a driver is mounted directly on one of a pair of substrates opposed to each other (for example, active matrix substrate) via a liquid crystal material (for example, see Patent Documents 1 to 5). Using this COG method allows the liquid crystal panel to have thinness, compactness, lightweight, and fineness between lines and between terminals. In particular, recently, compact liquid crystal panels with fineness have been demanded, which results in the increment of disconnection and short circuit of lines formed outside a display region. In other words, in a mounting step, mounting drivers on defective liquid crystal panels causes a loss of material costs and operating costs, and therefore, it becomes more important to inspect disconnection/short circuit of lines on the active matrix substrate in an inspection step during manufacture or the like of the liquid crystal panel.

FIG. 14 is a plan view showing a schematic configuration of a COG type liquid crystal panel 100 that has been used conventionally (for example, see Patent Document 6). As shown in FIG. 14, the liquid crystal panel 100 includes an active matrix substrate 200 and a counter substrate 300 opposed to the active matrix substrate 200. A liquid crystal material (not shown) is interposed between the active matrix substrate 200 and the counter substrate 300.

The active matrix substrate 200 has a display region 201, a terminal arrangement region 202, and a frame-shaped wiring region 203 that is positioned in an outer side of the display region 201 and surrounds the display region 201. Note here that one edge of the liquid crystal panel 100 is referred to as a first edge $S_1$ (the lower edge in FIG. 14), edges on the left and right sides with respect to the first edge $S_1$ are referred to as a second edge $S_2$ and a third edge $S_3$, respectively, and the edge opposed to the first edge $S_1$ is referred to as a fourth edge $S_4$.

The display region 201 is provided with a plurality of scanning lines 204, a plurality of data lines 205, and a plurality of storage capacity lines 206. Here, the plurality of scanning lines 204 that are formed in the display region 201 on the fourth edge $S_4$ side (the upper side in FIG. 14) (hereinafter, referred to as "upper scanning lines") respectively have input ends 207 for scanning signals on one end side. The plurality of scanning lines 204 that are formed in the display region 201 on the first edge $S_1$ side (the lower side in FIG. 14) (hereinafter, referred to as "lower scanning lines") respectively have input ends 208 for scanning signals on the other end side. Further, the plurality of data lines 205 respectively have input ends 209 for data signals on one end side.

In the terminal arrangement region 202, a plurality of scanning terminals 210 and a plurality of data terminals 211 are arranged.

In the frame-shaped wiring region 203, a plurality of first connection lines 212 connecting the input ends 207 of the upper scanning lines 204 for scanning signals with the scanning terminals 210, a plurality of second connection lines 213 connecting the input ends 208 of the lower scanning lines 204 for scanning signals with the scanning terminals 210, and a plurality of third connection lines 214 connecting the input ends 209 of the data lines 205 for data signals with the data terminals 211.

Further, in the frame-shaped wiring region 203, an upper disconnection inspection line 215 for inspecting disconnection of the upper scanning lines 204 and the first connection lines 212, and an upper disconnection inspection pad 216 connected with the upper disconnection inspection line 215 are formed. Thus, disconnection of the upper scanning lines 204 and the first connection lines 212 can be detected on the liquid crystal panel 100. Further, in the frame-shaped wiring region 203, a lower disconnection inspection line 217 for inspecting disconnection of the lower scanning lines 204 and the second connection lines 213, and a lower disconnection inspection pad 218 connected with the lower disconnection inspection line 217 are formed. Thus, disconnection of the lower scanning lines 204 and the second connection lines 213 can be detected on the liquid crystal panel 100.

Further, in the frame-shaped wiring region 203, a plurality of first switching elements 219, a first switching element control line 220 through which on/off control signals can be fed to the plurality of first switching elements 219, a first upper short circuit inspection line 221 for inspecting short circuit of the odd-numbered upper scanning lines 204 and the odd-numbered first connection lines 212, and a second upper short circuit inspection line 222 for inspecting short circuit of the even-numbered upper scanning lines 204 and the even-numbered first connection lines 212 are formed. Here, the first switching element control line 220 is connected with a control pad 223. The first upper short circuit inspection line 221 is connected with a first upper short circuit inspection pad 224. The second upper short circuit inspection line 222 is connected with a second upper short circuit inspection pad 225. Thus, short circuit of the upper scanning lines 204 and the first connection lines 212 can be detected on the liquid crystal panel 100.

Further, in the frame-shaped wiring region 203, a plurality of second switching elements 226, a second switching element control line 227 through which on/off control signals can be fed to the plurality of second switching elements 226, a first lower short circuit inspection line 228 for inspecting short circuit of the odd-numbered lower scanning lines 204 and the odd-numbered second connection lines 213, and a second lower short circuit inspection line 229 for inspecting short circuit of the even-numbered lower scanning lines 204 and the even-numbered second connection lines 213 are formed. Here, the second switching element control line 227 is connected with a control pad 230. The first lower short circuit inspection line 228 is connected with a first lower short circuit inspection pad 231. The second lower short circuit inspection line 229 is connected with a second lower short circuit inspection pad 232. Thus, short circuit of the lower scanning lines 204 and the second connection lines 213 can be detected on the liquid crystal panel 100.

Further, in the frame-shaped wiring region 203, a plurality of third switching elements 233, a third switching element control line 234 through which on/off control signals can be fed to the plurality of third switching elements 233, a first data inspection line 235 for inspecting disconnection/short circuit of the data line 205 for R(red), a second data inspection line 236 for inspecting disconnection/short circuit of the data line 205 for G(green), and a third data inspection line 237 for inspecting disconnection/short circuit of the data line 205 for B(blue) are formed. Here, the third switching element control line 234 is connected with a control pad 238. The first data inspection line 235 is connected with a first data inspection pad 239. The second data inspection line 236 is connected with a second data inspection pad 240. The third data inspection line 237 is connected with a third data inspection pad 241. Thus, disconnection/short circuit of the data lines 205 can be detected on the liquid crystal panel 100.

As described above, in the inspection step during manufacture or the like of the liquid crystal panel 100, disconnection/short circuit of lines in the active matrix substrate 200 can be inspected.

By the way, recently, the vertical and horizontal pixels of the display screens of liquid crystal panels used in compact electronic equipment such as mobile telephones, PDAs, and PHSs are now making a shift from 160×120 QQVGAs (Quarter Quarter Video Graphics Array) and 176×144 QCIFs (Quarter Common Intermediate Format) to 320×240 QVGAs (Quarter Video Graphics Array) and further to 640×480 VGAs (Video Graphics Array). Accordingly, the numbers of the scanning terminals 210 and the data terminals 211 to be arranged in the terminal arrangement region 202 of the liquid crystal panel 100 are increased. However, in order to meet the demand for a thinner, smaller, lighter, and low-cost liquid crystal panel 100, the numbers of the scanning terminals 210 and the data terminals 211 to be arranged in the terminal arrangement region 202 should be increased without extending the conventional terminal arrangement region 202. Consequently, spacings between terminals to be arranged in the terminal arrangement region 202 have gradually been reduced these days.

Here, in the aforementioned liquid crystal panel 100, in order to detect short circuit of the lower scanning lines 204 and the second connection lines 213 on the liquid crystal panel 100, in a section E of FIG. 14, it is necessary to form the second switching element control line 227, the first lower short circuit inspection line 228, and the second lower short circuit inspection line 229 in the terminal arrangement region 202. That is, at least three lines 227 to 229 provided for inspecting short circuit of the lower scanning lines 204 and the second connection lines 213 should have been formed in the terminal arrangement region 202. However, owing to the recent trend of reducing spacings between terminals to be arranged in the terminal arrangement region 202, it becomes difficult to form the three lines 227 to 229 in the terminal arrangement region 202. Therefore, in order not to form the three lines 227 to 229 in the terminal arrangement region 202, a liquid crystal panel 100a shown in FIG. 15 or a liquid crystal panel 100b shown in FIG. 16 has been considered.

In the liquid crystal panel 100a shown in FIG. 15, as compared with the liquid crystal panel 100 shown in FIG. 14, the three lines 227 to 229 are formed closer to an outer side (third edge $S_3$) of the frame-shaped wiring region 203 than the first connection lines 212. Thereby it is possible not to form the three lines 227 to 229 in the terminal arrangement region 202. Further, in the liquid crystal panel 100b shown in FIG. 16, as compared with the liquid crystal panel 100 shown in FIG. 14, the three lines 227 to 229 are once led out to the fourth edge $S_4$ side and then is led back to the first edge $S_1$, instead of directly being led out to the first edge $S_1$. Thereby, likewise the liquid crystal panel 100a shown in FIG. 15, the three lines 227 to 229 are not formed in the terminal arrangement region 202.

However, in the liquid crystal panel 100a shown in FIG. 15, since the three lines 227 to 229 are formed closer to the outer side of the frame-shaped wiring region 203 than the first connection lines 212, lead-out lines 242 that are led out from the one end side of the lower scanning lines 204 to the third edge $S_3$ side are newly formed in the frame-shaped wiring region 203. Because of this, as shown in FIG. 15, the first connection lines 212 and the lead-out lines 242 cross each other in an intersection portion A, which results in the generation of electric capacities in the intersection portion A. At this time, when observing one of the first connection lines 212, it crosses all the lead-out lines 242 connected with the lower scanning lines 204, and generates electric capacities at respective intersections. Meanwhile, when observing one of the lead-out lines 242 connected with the lower scanning lines 204, it crosses all the first connection lines 212, and generates electric capacities at respective intersections. Because of this, loads are increased both in the upper scanning lines 204 and the lower scanning lines 204, and therefore, scanning signals are unable to achieve a desired potential during a scanning period, or a period in which the desired potential is maintained is shortened. Consequently, data signals cannot be charged fully in picture elements, whereby the display quality is decreased.

Further, when the number of the upper scanning lines 204 and the number of the lower scanning lines 204 are different from each other, a load applied to the upper scanning lines 204 and a load applied to the lower scanning lines 204 are different. Thereby a potential to be achieved by the upper scanning lines 204 and a potential to be achieved by the lower scanning lines 204 will be different. Accordingly, a charging rate of the picture elements corresponding to the upper scanning lines 204 and a charging rate of the picture elements corresponding to the lower scanning lines 204 will be different. That is, in the picture elements corresponding to the scanning lines 204 having less lines, data signals from the data lines 205 are less likely to be charged, as compared with the picture elements corresponding to the scanning lines 204 having more lines. Consequently, when the liquid crystal panel 100a shown in FIG. 15 is mounted to electronic equipment, brightness of images will be different in the upper display screen and the lower display screen of the electronic equipment, whereby the display quality is decreased.

Further, in the liquid crystal panel 100b shown in FIG. 16, the three lines 227 to 229 are formed in the frame-shaped wiring region 203 so as to once be led out to the fourth edge $S_4$ side and then be led back to the first edge $S_1$ side. Because of this, as shown in FIG. 16, the first connection lines 212 and the three lines 227 to 229 cross each other in an intersection portion B. Meanwhile, the second connection lines 213 do not cross any lines. Thereby a potential to be achieved by the upper scanning lines 204 and a potential to be achieved by the lower scanning lines 204 will be different. Consequently, likewise the liquid crystal panel 100a shown in FIG. 15, when the liquid crystal panel 100b shown in FIG. 16 is mounted to the electronic equipment, brightness of images will be different in the upper display screen and the lower display screen of the electronic equipment, whereby the display quality is decreased, likewise the aforementioned liquid crystal panel 100a.

[Patent Document 1] JP 2003-172944 A
[Patent Document 2] JP 2005-301308 A
[Patent Document 3] JP 2003-241217 A
[Patent Document 4] JP 2004-325956 A
[Patent Document 5] JP 2005-241988 A
[Patent Document 6] WO 2008/015808 A

DISCLOSURE OF INVENTION

Problem to be Solved by the Invention

The present invention has been achieved in view of the above problems, and it is an object of the present invention to provide an active matrix substrate, a display device, a method for inspecting an active matrix substrate, and a method for inspecting a display device that are capable of improving a display quality without forming inspection lines for inspecting short circuits between connection lines in a terminal arrangement region.

Means for Solving Problem

To achieve the foregoing object, an active matrix substrate according to the present invention includes: a plurality of scanning lines formed parallel with one another in a display region; a plurality of data lines formed parallel with one another so as to cross the plurality of scanning lines in the display region; and a plurality of scanning terminals and a plurality of data terminals arranged in a terminal arrangement region, wherein the plurality of scanning lines include a plurality of first scanning lines having input ends for a scanning signal on one end side and a plurality of second scanning lines having input ends for a scanning signal on the other end side, and the first scanning lines and the second scanning lines are formed so as to alternate with one another one by one in the display region. The active matrix substrate further includes: a plurality of first connection lines connecting the input ends of the first scanning lines for a scanning signal with the scanning terminals; a plurality of second connection lines connecting the input ends of the second scanning lines for a scanning signal with the scanning terminals; a plurality of third connection lines connecting input ends of the data lines for a data signal with the data terminals; a plurality of first switching elements connected respectively with the plurality of first connection lines; a first inspection line crossing each of the plurality of first connection lines through which an inspection signal can be fed to the first switching elements that are not adjacent to one another, among the plurality of first switching elements; a second inspection line crossing each of the plurality of first connection lines through which an inspection signal can be fed to the first switching elements that are not connected with the first inspection line and are not adjacent to one another, among the plurality of first switching elements; a plurality of second switching elements connected respectively with the plurality of second connection lines; a third inspection line crossing each of the plurality of second connection lines through which an inspection signal can be fed to the second switching elements that are not adjacent to one another, among the plurality of second switching elements; and a fourth inspection line crossing each of the plurality of second connection lines through which an inspection signal can be fed to the second switching elements that are not connected with the third inspection line and are not adjacent to one another, among the plurality of second switching elements, wherein the first inspection line, the second inspection line, the third inspection line, and the fourth inspection line are formed in a frame-shaped wiring region, excluding the terminal arrangement region and the display region.

According to the active matrix substrate of the present invention, since the plurality of first switching elements, the first inspection line, and the second inspection line are provided, it is possible to feed different inspection signals to the adjacent first connection lines. Thereby, in the inspection step during manufacture or the like, short circuit between the adjacent first connection lines can be detected. That is, the first inspection line and the second inspection line are inspection lines for inspecting short circuit between the first connection lines. Further, according to the active matrix substrate of the present invention, since the plurality of second switching elements, the third inspection line, and the fourth inspection line are provided, it is possible to feed different inspection signals to the adjacent second connection lines. Thereby, in the inspection step during manufacture or the like, short circuit between the adjacent second connection lines can be detected. That is, the third inspection line and the fourth inspection line are inspection lines for inspecting short circuit between the second connection lines.

Further, the first inspection line and the second inspection line cross each of the plurality of first connection lines. Further, the third inspection line and the fourth inspection line cross each of the plurality of second connection lines. Thus, since both the plurality of first connection lines and the plurality of second connection lines cross the same number of the inspection lines, a load applied to the first connection lines and a load applied to the second connection lines are equal. Thereby a potential to be achieved by the first scanning lines connected with the first connection lines and a potential to be achieved by the second scanning lines connected with the second connection lines will be the same. Because of this, when the active matrix substrate according to the present invention is mounted to a display device, an image with uniform brightness can be displayed on the display screen of the display device. Further, the inspection lines 1 to 4 are formed in the frame-shaped wiring region, excluding the terminal arrangement region and the display region. Consequently, it is possible to realize the active matrix substrate capable of improving the display quality, without forming inspection lines for inspecting short circuits between connection lines in the terminal arrangement region.

Effect of the Invention

As described above, the active matrix substrate, the display device, and the method for inspecting the active matrix substrate exhibit an effect that a display quality can be improved without forming inspection lines for inspecting short circuits between connection lines in a terminal arrangement region.

BEST MODE FOR CARRYING OUT THE INVENTION

Figure 1:
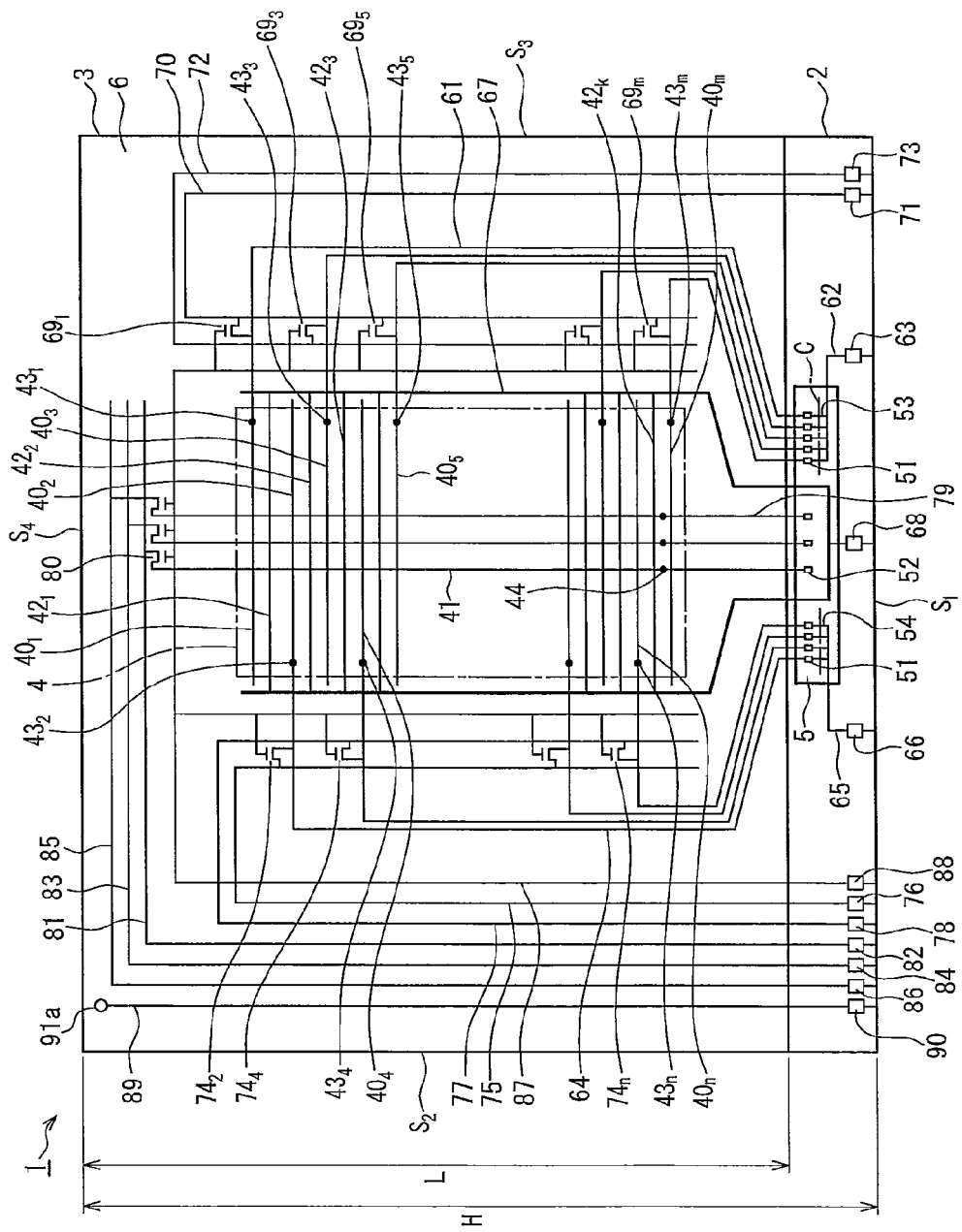
FIG. 1 is a plan view showing a schematic configuration of a liquid crystal panel according to the present embodiment.

An active matrix substrate according to an embodiment of the present invention includes: a plurality of scanning lines formed parallel with one another in a display region; a plurality of data lines formed parallel with one another so as to cross the plurality of scanning lines in the display region; and a plurality of scanning terminals and a plurality of data terminals arranged in a terminal arrangement region. The plurality of scanning lines include a plurality of first scanning lines having input ends for a scanning signal on one end side and a plurality of second scanning lines having input ends for a scanning signal on the other end side. In the display region, the first scanning lines and the second scanning lines are formed so as to alternate with one another one by one. The active matrix substrate includes: a plurality of first connection lines connecting the input ends of the first scanning lines for a scanning signal with the scanning terminals; a plurality of second connection lines connecting the input ends of the second scanning lines for a scanning signal with the scanning terminals; a plurality of third connection lines connecting input ends of the data lines for a data signal with the data terminals; a plurality of first switching elements connected respectively with the plurality of first connection lines. The active matrix substrate further includes: a first inspection line crossing each of the plurality of first connection lines through which an inspection signal can be fed to the first switching elements that are not adjacent to one another, among the plurality of first switching elements; a second inspection line crossing each of the plurality of first connection lines through which an inspection signal can be fed to the first switching elements that are not connected with the first inspection line and are not adjacent to one another, among the plurality of first switching elements; a plurality of second switching elements connected respectively with the plurality of second connection lines; a third inspection line crossing each of the plurality of second connection lines through which an inspection signal can be fed to the second switching elements that are not adjacent to one another, among the plurality of second switching elements; and a fourth inspection line crossing each of the plurality of second connection lines through which an inspection signal can be fed to the second switching elements that are not connected with the third inspection line and are not adjacent to one another, among the plurality of second switching elements. The first inspection line, the second inspection line, the third inspection line, and the fourth inspection line are formed in a frame-shaped wiring region, excluding the terminal arrangement region and the display region.

In the active matrix substrate according to the present embodiment described above, preferably, the plurality of first switching elements are formed in the frame-shaped wiring region so as to be close to the input ends of the first scanning lines for a scanning signal, and the plurality of second switching elements are formed in the frame-shaped wiring region so as to be close to the input ends of the second scanning lines for a scanning signal.

Here, contrary to this, a case is assumed in which the first switching elements are formed in the frame-shaped wiring region so as to be close to the terminal end side of the first scanning lines for scanning signals (that is, the other end side of the first scanning lines), and the second switching elements are formed in the frame-shaped wiring region so as to be close to the terminal end side of the second scanning lines for scanning signals (that is, one end side of the second scanning lines). In this case, it is necessary to newly form first lead-out lines in the frame-shaped wiring region for connecting the first switching elements with the terminal end side for scanning signals. It also is necessary to newly form second lead-out lines in the frame-shaped wiring region for connecting the second switching elements with the terminal end side for scanning signals. That is, since the first lead-out lines are newly formed in the frame-shaped wiring region, short circuit tends to occur between the first lead-out lines and the second connection lines. Further, since the second lead-out lines are newly formed in the frame-shaped wiring region, short circuit tends to occur between the second lead-out lines and the first connection lines. Still further, since the first lead-out lines and the second lead-out lines are newly formed in the frame-shaped wiring region, a space for forming other lines is reduced in the frame-shaped wiring region. Moreover, if a storage capacity main line is formed in the frame-shaped wiring region, the storage capacity main line and the first lead-out lines as well as the storage capacity main line and the second lead-out lines cross one another. Since the storage capacity main line and the first lead-out lines cross one another, heavy loads are imposed on the first scanning lines. Further, since the storage capacity main line and the second lead-out lines cross one another, heavy loads are imposed on the second scanning lines. That is, since the heavy loads are imposed on the scanning lines, the scanning signals to be fed to the scanning lines are delayed, and therefore, it is difficult to charge data signals from the data lines in the storage capacitors. Consequently, when such an active matrix substrate is mounted to a display device, a display screen of the display device displays, for example, images not having a desired brightness.

On the other hand, in the active matrix substrate according to the present embodiment, since the plurality of first switching elements are formed in the frame-shaped wiring region so as to be close to the input ends of the first scanning lines for scanning signals, and also the plurality of second switching elements are formed in the frame-shaped wiring region so as to be close to the input ends of the second scanning lines for scanning signals, it is unnecessary to form the foregoing first lead-out lines and the second lead-out lines in the frame-shaped wiring region. Therefore, the active matrix substrate according to the present embodiment does not cause problems described above. Consequently, it is possible to realize an active matrix substrate capable of improving the yield along with the improvement in the display quality.

In the active matrix substrate according to the present embodiment described above, preferably, the first inspection line and the second inspection line are adjacent to each other; the third inspection line and the fourth inspection line are adjacent to each other; at least one of the plurality of first switching elements is arranged between the first inspection line and the second inspection line; and at least one of the plurality of second switching elements is arranged between the third inspection line and the fourth inspection line. Specifically, preferably, all of the plurality of first switching elements are arranged between the first inspection line and the second inspection line, and all of the plurality of second switching elements are arranged between the third inspection line and the fourth inspection line. This configuration makes it possible to suppress the occurrence of defects in manufacturing, thereby realizing the downsizing of the active matrix substrate.

In the active matrix substrate according to the present embodiment described above, preferably, a control line through which a control signal for controlling ON/OFF of the first switching elements can be fed is formed between the first inspection line and the second inspection line; the first switching elements are arranged on both sides with respect to the control line; a control line through which a control signal for controlling ON/OFF of the second switching elements can be fed is formed between the third inspection line and the fourth inspection line; and the second switching elements are arranged on both sides with respect to the control line. Specifically, preferably, the first switching elements are arranged alternately on the right and the left sides with respect to the control line, and the second switching elements are arranged alternately on the right and the left sides with respect to the control line. This configuration makes it possible to suppress the occurrence of defects in manufacturing, thereby realizing the downsizing of the active matrix substrate.

In the active matrix substrate according to the present embodiment described above, preferably, a plurality of first extension lines extended individually from the plurality of scanning terminals connected respectively with the plurality of first connection lines; a fifth inspection line connected with each of the plurality of first extension lines through which an inspection signal can be fed; a plurality of second extension lines extended individually from the plurality of scanning terminals connected respectively with the plurality of second connection lines; and a six inspection line connected with each of the plurality of second extension lines through which an inspection signal can be fed.

According to the foregoing configuration, inspection signals can be fed from the fifth inspection line via the first extension lines and the scanning terminals to the first connection lines and the first scanning lines. Further, inspection signals can be fed from the six inspection line via the second extension lines and the scanning terminals to the second connection lines and the second scanning lines. Incidentally, if lines of the active matrix substrate are charged with static electricity, discharge can possibly occurs, which might lead to short circuits or disconnections. In contrast, in the active matrix substrate according to the present embodiment, the first extension lines extended individually from the plurality of scanning terminals are connected with the fifth inspection line, and the second extension lines extended individually from the plurality of scanning terminals are connected with the sixth inspection line. This allows the static electricity generated in the active matrix substrate to be removed or dispersed via the fifth inspection line and the sixth inspection line. Therefore, it is possible to suppress the occurrence of defects in the active matrix substrate due to static electricity. Consequently, it is possible to realize an active matrix substrate capable of improving the yield.

In the active matrix substrate according to the present embodiment described above, preferably, the data lines have input ends for a data signal on one end side, the active matrix substrate further includes: a plurality of third switching elements connected with the other end side of the data lines; a seventh inspection line through which an inspection signal can be fed to the third switching elements that are not adjacent to one another, among the plurality of third switching elements; and a eighth inspection line through which an inspection signal can be fed to the third switching elements that are not connected with the seventh inspection line and are not adjacent to one another, among the plurality of third switching elements.

According to the foregoing configuration, since the plurality of third switching elements, the seventh inspection line, and the eighth inspection line are provided, it is possible to feed different inspection signals to the adjacent data lines and the adjacent third connection lines. Thereby, in the inspection step during manufacture or the like, short circuit between the adjacent data lines and between the adjacent third connection lines can be detected.

Further, the display device including the active matrix substrate according to any of the foregoing configurations is an embodiment of the present invention. This display device is performed, for example, as a liquid crystal display device.

Further, to achieve the foregoing object, a method for inspecting the active matrix substrate according to an embodiment of the present invention or a display device includes the steps of inspecting the first connection lines by feeding inspection signals independent from each other to the first inspection line and the second inspection line, respectively, while maintaining the first switching elements in an ON state; and inspecting the second connection lines by feeding inspection signals independent from each other to the third inspection line and the fourth inspection line, respectively, while maintaining the second switching elements in an ON state.

According to the foregoing inspection method, by feeding inspection signals independent from each other to the first inspection line and the second inspection line, respectively, while maintaining the first switching elements in an ON state, it is possible to detect short circuit of at least the first connection lines. Further, by feeding inspection signals independent from each other to the third inspection line and the fourth inspection line, respectively, while maintaining the second switching elements in an ON state, it is possible to detect short circuit of at least the second connection lines. Note here that the step of inspecting the first connection lines may be performed before or after the step of inspecting the second connection lines.

Further, the foregoing inspection method includes the steps of inspecting the first scanning lines by feeding an inspection signal thereto from the fifth inspection line; inspecting the second scanning lines by feeding an inspection signal thereto from the sixth inspection line; inspecting the data lines by feeding inspection signals independent from each other to the seventh inspection line and the eighth inspection line, respectively, while maintaining the third switching elements in an ON state; cutting the plurality of first extension lines and the plurality of second extension lines; inspecting the first connection lines by feeding inspection signals independent from each other to the first inspection line and the second inspection line, respectively, while maintaining the first switching elements in an ON state; and inspecting the second connection lines by feeding inspection signals independent from each other to the third inspection line and the fourth inspection line, respectively, while maintaining the second switching elements in an ON state.

According to this inspection method, by feeding an inspection signal from the fifth inspection line, it is possible to detect disconnection of at least the first scanning lines. Further, by feeding an inspection signal from the sixth inspection line, it is possible to detect disconnection of at least the second scanning lines. Further, by feeding inspection signals independent from each other to the seventh inspection line and the eighth inspection line, respectively, while maintaining the third switching elements in an ON state, it is possible to detect short circuit/disconnection of the data lines. Then, in a cutting step, by cutting the plurality of first extension lines and the plurality of second extension lines, the scanning terminals that are connected electrically by the fifth inspection line and the sixth inspection line are cut from one another electrically. Further, by feeding inspection signals independent from each other to the first inspection line and the second inspection line, respectively, while maintaining the first switching elements in an ON state, it is possible to detect short circuit of at least the first connection lines. Furthermore, by feeding inspection signals independent from each other to the third inspection line and the fourth inspection line, respectively, while maintaining the second switching elements in an ON state, it is possible to detect short circuit of at least the second connection lines.

The following describes a more specific embodiment of the present invention while referring to the drawings. Note here that for convenience of explanation, the drawings referred to herein are simplified drawings showing exclusively principal members necessary for explaining the present invention, among constituent members of the embodiment of the present invention. An active matrix substrate according to the present invention therefore possibly includes arbitrary constitutional members not shown in the drawings referred to in the present specification. Besides, dimensions of the members shown in the drawings do not faithfully represent the actual dimensions of the constitutional members and the actual dimension ratios of the members.

FIG. 1 is a plan view showing a schematic configuration of a liquid crystal panel 1 according to the present embodiment. The liquid crystal panel 1 includes an active matrix substrate 2 and a counter substrate 3 opposed to the active matrix substrate 2, as shown in FIG. 1. A liquid crystal material (not shown) is interposed between the active matrix substrate 2 and the counter substrate 3. Note here that a color filter layer that includes color filters of R(red), G(green), and B(blue) and a black matrix for preventing light leakage between these color filters is formed on the counter substrate 3 according to the present embodiment. Further, a common electrode is formed on the color filter layer.

Here, the liquid crystal panel 1 according to the present embodiment can be used in, for example, electronic equipment for portable terminals, such as mobile telephones, PDAs (Personal Digital Assistant), PHSs (Personal Handy-phone System), and HHTs (Hand Held Terminal). Further, the liquid crystal panel 1 according to the present embodiment can be used in electronic equipment other than the aforementioned electronic equipment for portable terminals, such as game terminals, car navigation systems, personal computers, televisions, video cameras, and digital cameras. Here, the electronic equipment provided with the liquid crystal panel 1 is an embodiment of a liquid crystal display device according to the present invention. Note here that the active matrix substrate 2 according to the present embodiment may be provided in a panel (display device) other than the liquid crystal panel 1, such as a field emission display, a plasma display, or an organic EL display.

The active matrix substrate 2 has a display region 4, a terminal arrangement region 5, and a frame-shaped wiring region 6 that is positioned in an outer side of the display region 4 and surrounds the display region 4. Hereinafter, one edge of the liquid crystal panel 1 is referred to as a first edge $S_1$ (the lower edge in FIG. 1), edges on the left and right sides with respect to the first edge $S_1$ are referred to as a second edge $S_2$ and a third edge $S_3$, respectively, and the edge opposed to the first edge $S_1$ is referred to as a fourth edge $S_4$.

Here, as shown in FIG. 1, the second edge $S_2$ (third edge $S_3$) of the active matrix substrate 2 has a length H longer than a length L of the second edge $S_2$ (third edge $S_3$) of the counter substrate 3. Because of this, in the case where the active matrix substrate 2 and the counter substrate 3 are applied to each other via the liquid crystal material (not shown), the terminal arrangement region 5 of the active matrix substrate 2 is positioned closer to the first edge $S_1$ side as compared with the counter substrate 3.

The display region 4 is provided with a plurality of first scanning lines $40_1, 40_3, 40_5, \ldots 40_m$, a plurality of second scanning lines $40_2, 40_4, 40_6, \ldots 40_n$, a plurality of data lines $41_1, 41_2, 41_3, \ldots 41_i$, and a plurality of storage capacity lines $42_1, 42_2, 42_3, \ldots 42_k$. Here, the first scanning lines $40_1, 40_3, 40_5, \ldots 40_m$ have input ends $43_1, 43_3, 43_5, \ldots 43_m$ for scanning signals on one end side, respectively. The second scanning lines $40_2, 40_4, 40_6, \ldots 40_n$ have input ends $43_2, 43_4, 43_6, \ldots 43_n$ for scanning signals on the other end side, respectively. Further, the data lines $41_1, 41_2, 41_3, \ldots 41_i$ have input ends $44_1, 44_2, 44_3, \ldots 44_i$ for data signals on one end side, respectively. Note here that, in FIG. 1, the data lines $41_1, 41_2, 41_3, \ldots 41_i$ are expressed simply by 41 and the input ends $44_1, 44_2, 44_3, \ldots 44_i$ for data signals are expressed simply by 44.

Note here that, hereinafter, only when it is necessary to distinguish lines and switching elements individually, small numbers are used for the explanation, such as data line $41_1$. When it is not particularly necessary to distinguish them individually or when they are referred to collectively, small members are not used for the explanation, such as data line 41.

Here, in the present embodiment, the first scanning lines $40_1, 40_3, 40_5, \ldots 40_m$ and the second scanning lines $40_2, 40_4, 40_6, \ldots 40_n$ are formed parallel with one another and arranged so as to alternate with one another one by one in the display region 4. Further, the storage capacity lines $42_1, 42_2, 42_3, \ldots 42_k$ are formed so as to be parallel with the scanning lines 40 in the display region 4. That is, the display region 4 includes the scanning lines 40 and the storage capacity lines 42 in the order of: the first scanning line $40_1$, storage capacity line $42_1$, second scanning line $40_2$, storage capacity line $42_2$, first scanning line $40_3$, storage capacity line $42_3$, second scanning line $40_4$, in the direction from the fourth edge $S_4$ side to the first edge $S_1$ side. Further, the data lines $41_1, 41_2, 41_3, \ldots 41_i$ are formed parallel with one another and formed so as to cross the scanning lines 40 and the storage capacity lines 42 in the display region 4. Note here that, in the present embodiment, the data lines 41 are formed per R(red), G(green) and B(blue) in the display region 4, but the present invention is not limited thereto in the case of using a monochrome liquid crystal panel 1.

Note here that, at respective intersections of the scanning lines 40 and the data lines 41, switching elements such as TFTs (Thin Film Transistor) or MIMs (Metal Insulator Metal) (not shown), picture element electrodes (R, G or B) (not shown) connected with the switching elements, and the like are formed. Further, the storage capacity lines 42 form storage capacitors (not shown) using electrodes connected with the switching elements as storage capacitor opposing electrodes.

The terminal arrangement region 5 is a region in the active matrix substrate 2 in which a plurality of scanning terminals 51 and a plurality of data terminals 52 are arranged. A driver or a flexible circuit board with a driver is connected electrically with the scanning terminals 51 and the data terminals 52 in the terminal arrangement region 5. Thus, the scanning terminals 51 are terminals through which scanning signals can be fed from the driver. Further, the data terminals 52 are terminals through which data signals can be fed from the driver. Note here that the driver can be connected with the terminal arrangement region 5 by the COG (Chip On Glass) method. Further, the flexible circuit board provided with a driver can be connected with the terminal arrangement region 5 by the TCP (Tape Carrier Package) method. The connecting method is not particularly limited here.

An example is shown in FIG. 1 in which one driver can be disposed in the terminal arrangement region 5, but the present invention is not limited to this. For example, by forming a plurality of the terminal arrangement regions 5 on the active matrix substrate 2, a plurality of drivers may be disposed on each of the plurality of the terminal arrangement regions 5.

In the frame-shaped wiring region 6, a plurality of first connection lines $61_1, 61_3, 61_5, \ldots 61_m$ are formed that connect the input ends $43_1, 43_3, 43_5, \ldots 43_m$ for scanning signals on one end side of the first scanning lines $40_1, 40_3, 40_5, \ldots 40_m$ with the scanning terminals 51. That is, the first connection lines 61 are led out from the input ends $43_1, 43_3, 43_5, \ldots 43_m$ for scanning signals to the third edge $S_3$ side; formed in the frame-shaped wiring region 6 along the third edge $S_3$; and connected with the plurality of scanning terminals 51. Note here that, in FIG. 1, the first connection lines $61_1, 61_3, 61_5, \ldots 61_m$ are expressed simply by 61.

Here, the plurality of scanning terminals 51 that are connected with the first connection lines 61 are connected with a plurality of first extension lines 53 extended individually from the plurality of scanning terminals 51 toward the first edge $S_1$ side. Further, the plurality of first extension lines 53 are connected with an inspection line (fifth inspection line) 62 for the first scanning lines. That is, the inspection line 62 for the first scanning lines is connected with each of the plurality of first extension lines 53. The inspection line 62 for the first scanning lines is connected further with an inspection pad 63 for the first scanning lines. The inspection pad 63 for the first scanning lines is a pad through which a scanning inspection signal can be fed. Note here that the scanning inspection signal is an inspection signal functioning as a scanning signal.

In the present embodiment, since the inspection line 62 for the first scanning lines is connected with each of the plurality of first extension lines 53, it is possible to collectively feed scanning inspection signals to the first scanning lines $40_1, 40_3, 40_5, \ldots 40_m$ via the inspection pad 63 for the first scanning lines. Further, since the inspection line 62 for the first scanning lines is connected with each of the plurality of first extension lines 53, it is possible to remove or disperse static electricity generated in the active matrix substrate 2 via the inspection line 62 for the first scanning lines and the inspection pad 63 for the first scanning lines, whereby short circuit or disconnection of lines owing to the static electricity, the change in properties of TFTs or MIMs, and the like can be suppressed.

Further, in the frame-shaped wiring region 6, a plurality of second connection lines $64_2, 64_4, 64_6, \ldots 64_n$ are formed that connect the input ends $43_2, 43_4, 43_6, \ldots 43_n$ for scanning signals on the other end side of the second scanning lines $40_2, 40_4, 40_6, \ldots 40_n$ with the scanning terminals 51. That is, the second connection lines 64 are led out from the input ends $43_2, 43_4, 43_6, \ldots 43_n$ for scanning signals to the second edge $S_2$ side; formed in the frame-shaped wiring region 6 along the second edge $S_2$; and connected with the plurality of scanning terminals 51. Note here that, in FIG. 1, the second connection lines $64_2, 64_4, 64_6, \ldots 64_n$ are expressed simply by 64.

Here, the plurality of scanning terminals 51 that are connected with the second connection lines 64 are connected with a plurality of second extension lines 54 extended individually from the plurality of scanning terminals 51 to the first edge $S_1$ side. Further, the plurality of second extension lines 54 are connected with an inspection line (sixth inspection line) 65 for the second scanning lines. That is, the inspection line 65 for the second scanning lines is connected with each of the plurality of second extension lines 54. The inspection line 65 for the second scanning lines is connected further with an inspection pad 66 for the second scanning lines. The inspection pad 66 for the second scanning lines is a pad through which a scanning inspection signal can be fed.

In the present embodiment, since the inspection line 65 for the second scanning lines is connected with each of the plurality of second extension lines 54, it is possible to collectively feed scanning inspection signals to the second scanning lines $40_2, 40_4, 40_6, \ldots 40_n$ via the inspection pad 66 for the second scanning lines. Further, since the inspection line 65 for the second scanning lines is connected with each of the plurality of second extension lines 54, it is possible to remove or disperse static electricity generated in the active matrix substrate 2 via the inspection line 65 for the second scanning lines and the inspection pad 66 for the second scanning lines.

Further, in the frame-shaped wiring region 6, a storage capacity main line 67 is provided closer to the display region 4 side, as compared with the first connection lines 61 and the second connection lines 64. The storage capacity main line 67 is formed in the frame-shaped wiring region 6 along the second edge $S_2$ and the third edge $S_3$ so as to sandwich the display region 4 from the left and right sides. That is, one end side and the other end side of the storage capacity lines 42 are connected with the storage capacity main line 67. The storage capacity main line 67 is connected further with an inspection pad 68 for the storage capacity lines via the terminal arrangement region 5. The inspection pad 68 for the storage capacity lines is a pad through which a storage capacity inspection signal can be fed. Thus, it is possible to feed a storage capacity inspection signal to the storage capacity lines 42 via the inspection pad 68 for the storage capacity lines. Note here that the storage capacity inspection signal is an inspection signal for detecting disconnection of the storage capacity lines 42.

Here, a case is assumed in which, in a state of the liquid crystal panel 1, by feeding an inspection signal to each of the scanning lines 40 and the data lines 41, a defect in each picture element and the conductive state of each line are inspected from the display state of each picture element. Especially in the case where the scanning inspection signal is a signal for periodically repeating a potential of turning on the switching elements and a potential of turning off the switching elements, it is preferable to supply a potential to be a standard to one of the electrodes of the storage capacitor in the picture element for preventing the display from being unstable. Further, the storage capacity main line 67 can be used for inspecting short circuit of the scanning lines 40 and the storage capacity lines 42. For example, in the state of the liquid crystal panel 1, a scanning inspection signal is fed to the storage capacity lines 42 via the inspection pad 68 for the storage capacity lines, with a data inspection signal fed to the data lines 41 and no signal fed to the scanning lines 40. When there is short circuit between any of the storage capacity lines 42 and the scanning lines 40, the scanning inspection signal is fed to the scanning line 40 from the portion having the short circuit, whereby only the scanning line 40 having the short circuit with the storage capacity line 42 is displayed irregularly. In the same manner, it is possible to use the storage capacity main line 67 for inspecting short circuit between the data line 41 and the storage capacity line 42.

Further, in the frame-shaped wiring region 6, a plurality of first switching elements $69_1, 69_3, 69_5, \ldots 69_m$ are provided that are connected respectively with the first connection lines $61_1, 61_3, 61_5, \ldots 61_m$. That is, the first switching elements 69 are formed in the frame-shaped wiring region 6 so as to be close to the input ends $43_1, 43_3, 43_5, \ldots 43_m$ for scanning signals.

Here, the first switching elements $69_1, 69_5, 69_9, \ldots 69_{m-1}$ among the plurality of first switching elements 69 are connected further with a first inspection line (first inspection line) 70 for the first connection lines. That is, the first inspection line 70 for the first connection lines is an inspection line through which scanning inspection signals can be fed to, among the plurality of first switching elements 69, those which are not adjacent to one another. Note here that the first inspection line 70 for the first connection lines is formed in the frame-shaped wiring region 6 so as to cross the plurality of first connection lines 61. The first inspection line 70 for the first connection lines is connected further with a first inspection pad 71 for the first connection lines. The first inspection pad 71 for the first connection lines is a pad through which a scanning inspection signal can be fed. Thus, scanning inspection signals can be fed to the first connection lines $61_1, 61_5, 61_9, \ldots 61_{m-1}$ via the first inspection pad 71 for the first connection lines.

Further, the first switching elements $69_3, 69_7, 69_{11}, \ldots 69_m$ among the plurality of first switching elements 69 are connected further with a second inspection line (second inspection line) 72 for the first connection lines. That is, the second inspection line 72 for the first connection lines is an inspection line through which scanning inspection signals can be fed to, among the plurality of first switching elements 69, those which are not connected with the first inspection line 70 for the first connection lines and are not adjacent to one another. Note here that the second inspection line 72 for the first connection lines is formed in the frame-shaped wiring region 6 so as to cross the plurality of first connection lines 61. The second inspection line 72 for the first connection lines is connected further with a second inspection pad 73 for the first connection lines. The second inspection pad 73 for the first connection lines is a pad through which a scanning inspection signal can be fed. Thus, scanning inspection signals can be fed to the first connection lines $61_3, 61_7, 61_{11}, \ldots 61_m$ via the second inspection pad 73 for the first connection lines.

In other words, in the frame-shaped wiring region 6, as described above, since the first inspection line 70 for the first connection lines, the first inspection pad 71 for the first connection lines, the second inspection line 72 for the first connection lines, and the second inspection pad 73 for the first connection lines are formed, different scanning inspection signals can be fed to the adjacent first connection lines 61, respectively. Thereby any short circuit (leak) in the first connection lines 61 can be detected. Further, in the frame-shaped wiring region 6, as described above, the first inspection line 70 for the first connection lines and the second inspection line 72 for the first connection lines are formed so as to cross each of the plurality of first connection lines 61.

Further, in the frame-shaped wiring region 6, second switching elements $74_2, 74_4, 74_6, \ldots 74_n$ are formed that are connected respectively with the second connection lines $64_2, 64_4, 64_6, \ldots 64_n$. That is, the second switching elements 74 are formed in the frame-shaped wiring region 6 so as to be close to the input ends $43_2, 43_4, 43_6, \ldots 43_n$ for scanning signals.

Here, the second switching elements $74_2, 74_6, 74_{10}, \ldots 74_{n-1}$ among the plurality of second switching elements 74 are connected further with a first inspection line (third inspection line) 75 for the second connection lines. That is, the first inspection line 75 for the second connection lines is an inspection line through which scanning inspection signals can be fed to, among the plurality of second switching elements 74, those which are not adjacent to one another. Note here that the first inspection line 75 for the second connection lines is formed in the frame-shaped wiring region 6 so as to cross the second connection lines 64. The first inspection line 75 for the second connection lines is connected further with a first inspection pad 76 for the second connection lines. The first inspection pad 76 for the second connection lines is a pad through which a scanning inspection signal can be fed. Thus, scanning inspection signals can be fed to the second connection lines $64_2, 64_6, 64_{10}, \ldots 64_{n-1}$ via the first inspection pad 76 for the second connection lines.

Further, the second switching elements $74_4, 74_8, 74_{12}, \ldots 74_n$ among the plurality of second switching elements 74 are connected further with a second inspection line (fourth inspection line) 77 for the second connection lines. That is, the second inspection line 77 for the second connection lines is an inspection line through which scanning inspection signals can be fed to, among the plurality of second switching elements 74, those which are not connected with the first inspection line 75 for the second connection lines and are not adjacent to one another. Note here that the second inspection line 77 for the second connection lines is formed in the frame-shaped wiring region 6 so as to cross the second connection lines 64. The second inspection line 77 for the second connection lines is connected further with a second inspection pad 78 for the second connection lines. The second inspection pad 78 for the second connection lines is a pad through which a scanning inspection signal can be fed. Thus, scanning inspection signals can be fed to the second connection lines $64_4, 64_8, 64_{12}, \ldots 64_n$ via the second inspection pad 78 for the second connection lines.

In other words, in the frame-shaped wiring region 6, as described above, since the first inspection line 75 for the second connection lines, the first inspection pad 76 for the second connection lines, the second inspection line 77 for the second connection lines and the second inspection pad 78 for the second connection lines are formed, different scanning inspection signals can be fed to the adjacent second connection lines 64, respectively. Thereby any short circuit (leak) in the second connection lines 64 can be detected. Further, in the frame-shaped wiring region 6, as described above, the first inspection line 75 for the second connection lines and the second inspection line 77 for the second connection lines are formed so as to cross each of the plurality of second connection lines 64.

In the present embodiment, as described above, the first switching elements 69 are formed in the frame-shaped wiring region 6 so as to be close to the input ends $43_1$, $43_3$, $43_5$, ... $43_m$ for scanning signals, and the second switching elements 74 are formed in the frame-shaped wiring region 6 so as to be close to the input ends $43_2$, $43_4$, $43_6$, ... $43_n$ for scanning signals. Here, contrary to this, a case is assumed in which the first switching elements 69 are formed on the terminal end side for scanning signals (that is, the other end side of the first scanning lines $40_1$, $40_3$, $40_5$, ... $40_m$) in the frame-shaped wiring region 6, and the second switching elements 74 are formed on the terminal end side for scanning signals (that is, one end side of the second scanning lines $40_2$, $40_4$, $40_6$, ... $40_n$) in the frame-shaped wiring region 6.

Figure 2:
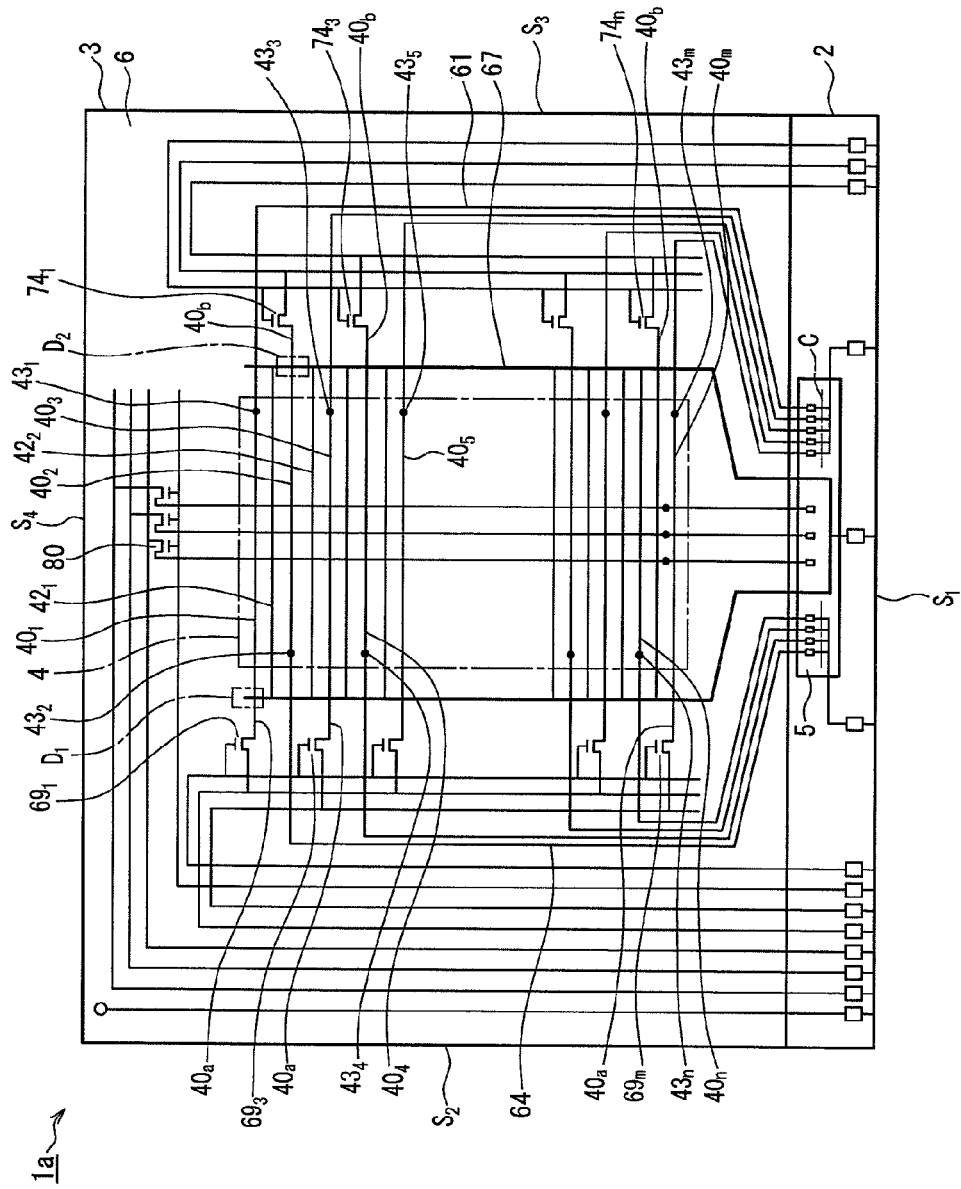
FIG. 2 is a plan view showing a schematic configuration of another liquid crystal panel according to the present embodiment.

FIG. 2 is a plan view showing a schematic configuration of a liquid crystal panel 1a in which the first switching elements 69 and the second switching elements 74 are formed on the terminal end side for scanning signals in the frame-shaped wiring region 6. For ease of explanation, in FIG. 2, reference numerals are given only to the principal members. As shown in FIG. 2, since the first switching elements 69 are formed on the terminal end side for scanning signals in the frame-shaped wiring region 6, first lead-out lines 40a that are led out from the other end side of the first scanning lines $40_1$, $40_3$, $40_5$, ... $40_m$ to the second edge $S_2$ side are newly formed in the frame-shaped wiring region 6. That is, the first lead-out lines 40a connect the other end side of the first scanning lines $40_1$, $40_3$, $40_5$, ... $40_m$ with the first switching elements 69. Further, since the second switching elements 74 are formed on the terminal end side for scanning signals in the frame-shaped wiring region 6, second lead-out lines 40b that are led out from the other end side of the second scanning lines $40_2$, $40_4$, $40_6$, ... $40_n$ to the third edge $S_3$ side are newly formed in the frame-shaped wiring region 6. That is, the second lead-out lines 40b connect the other end side of the second scanning lines $40_2$, $40_4$, $40_6$, ... $40_n$ with the second switching elements 74.

In other words, in a section $D_1$ shown in FIG. 2, the storage capacity main line 67 and the first lead-out line 40a cross each other, which causes heavy loads on the first scanning lines $40_1$, $40_3$, $40_5$, ... $40_m$. Further, in a section $D_2$ shown in FIG. 2, the storage capacity main line 67 and the second lead-out line 40b cross each other, which causes heavy loads on the second scanning lines $40_2$, $40_4$, $40_6$, ... $40_n$. That is, since such heavy loads are imposed on the scanning lines 40, the scanning signals to be fed to the scanning lines 40 are delayed, and hence it is difficult to charge data signals from the data lines 41 in the storage capacitors. As a result, when the liquid crystal panel la shown in FIG. 2 is mounted to electronic equipment, a display screen of the electronic equipment is, for example, unable to display images having a desired brightness. In short, the display quality of the liquid crystal panel 1a is decreased.

On the other hand, in the liquid crystal panel 1 according to the present embodiment, as shown in FIG. 1, since the first switching elements 69 and the second switching elements 74 are formed in the frame-shaped wiring region 6 so as to be close to the input ends for scanning signals, it is unnecessary to form the aforementioned first lead-out lines 40a and the second lead-out lines 40b in the frame-shaped wiring region 6. Therefore, the storage capacity main line 67 and the first lead-out lines 40a, as well as the storage capacity main line 67 and the second lead-out lines 40b do not cross each other. Consequently, the liquid crystal panel 1 according to the present embodiment does not cause problems described above.

Further, in the liquid crystal panel 1a shown in FIG. 2, since the first lead-out lines 40a are newly formed in the frame-shaped wiring region 6, short circuit tends to occur between the first lead-out lines 40a and the second connection lines 64. Furthermore, since the second lead-out lines 40b are newly formed in the frame-shaped wiring region 6, short circuit tends to occur between the second lead-out lines 40b and the first connection lines 61. Moreover, since the first lead-out lines 40a and the second lead-out lines 40b are newly formed in the frame-shaped wiring region 6, a space for forming other lines or switching elements is reduced in the frame-shaped wiring region 6, which increases short circuits of lines or switching elements.

On the other hand, in the liquid crystal panel 1 according to the present embodiment, as shown in FIG. 1, since the first switching elements 69 and the second switching elements 74 are formed in the frame-shaped wiring region 6 so as to be close to the input ends 43 for scanning signals, it is unnecessary to form the aforementioned first lead-out lines 40a and the second lead-out lines 40b in the frame-shaped wiring region 6. Consequently, the liquid crystal panel 1 according to the present embodiment does not cause problems described above.

In view of these, preferably, the liquid crystal panel is configured so that the first switching elements 69 and the second switching elements 74 are formed close to the input ends 43 for scanning signals in the frame-shaped wiring region 6 (see FIG. 1), as compared with a configuration in which the first switching elements 69 and the second switching elements 74 are formed close to the terminal ends for scanning signals in the frame-shaped wiring region 6 (see FIG. 2). That is, the liquid crystal panel 1 shown in FIG. 1 improves the yield along with the improvement in the display quality, as compared with the liquid crystal panel 1a shown in FIG. 2.

Now, referring to FIG. 1 again, in the frame-shaped wiring region 6, a plurality of third connection lines $79_1$, $79_2$, $79_3$, ... $79_i$ are formed that connect the input ends $44_1$, $44_2$, $44_3$, ... $44_i$ for data signals on one end side of the data lines $41_1$, $41_2$, $41_3$, ... $41_i$ with the data terminals 52. That is, the third connection lines 79 are led out from the input ends $44_1$, $44_2$, $44_3$, ... $44_i$ for data signals to the first edge $S_1$ side, and connected with the plurality of data terminals 52. Note here that, in FIG. 1, the third connection lines $79_1$, $79_2$, $79_3$, ... $79_i$ are expressed simply by 79.

Further, in the frame-shaped wiring region 6, third switching elements $80_1$, $80_2$, $80_3$, ... $80_i$ are formed that are connected with the other end side of the data lines $41_1$, $41_2$, $41_3$, ... $41_i$.

Here, the third switching elements $80_1$, $80_4$, $80_7$, ... $80_{i-2}$ among the plurality of third switching elements 80 are connected further with a first inspection line (seventh inspection line) 81 for the data lines. That is, the first inspection line 81 for the data lines is an inspection line through which a data inspection signal can be fed to, among the plurality of third switching elements 80, those which are not adjacent to one another. Note here that the first inspection line 81 for the data lines is formed on the fourth edge $S_4$ side and the second edge $S_2$ side of the frame-shaped wiring region 6. The first inspection line 81 for the data lines is connected further with a first inspection pad 82 for the data lines. The first inspection pad 82 for the data lines is a pad through which a data inspection signal can be fed. Note here that the data inspection signal is an inspection signal functioning as a data signal. Thus, a data inspection signal can be fed to the data lines $41_1$, $41_4$, $41_7$, ... $41_{i-2}$ via the first inspection pad 82 for the data lines.

Further, the third switching elements $80_2$, $80_5$, $80_8$, ... $80_{i-1}$ among the plurality of third switching elements 80 are connected further with a second inspection line (eighth inspection line) 83 for the data lines. That is, the second inspection line 83 for the data lines is an inspection line through which a data inspection signal can be fed to, among the plurality of third switching elements 80, those which are not connected with the first inspection line 81 for the data lines and are not adjacent to one another. Likewise the first inspection line 81 for the data lines, the second inspection line 83 for the data lines is formed on the fourth edge $S_4$ side and the second edge $S_2$ side of the frame-shaped wiring region 6. The second inspection line 83 for the data lines is connected further with a second inspection pad 84 for the data lines. The second inspection pad 84 for the data lines is a pad through which a data inspection signal can be fed. Thus, a data inspection signal can be fed to the data lines $41_2$, $41_5$, $41_8$, ... $41_{i-1}$ via the second inspection pad 84 for the data lines.

Further, the third switching elements $80_3$, $80_6$, $80_9$, ... $80_i$ among the plurality of third switching elements 80 are connected further with a third inspection line (eighth inspection line) 85 for the data lines. That is, the third inspection line 85 for the data lines is an inspection line through which a data inspection signal can be fed to, among the plurality of third switching elements 80, those which are connected with neither the first inspection line 81 for the data lines nor second inspection line 83 for the data lines, and are not adjacent to one another. Likewise the first inspection line 81 for the data lines and second inspection line 83 for the data lines, the third inspection line 85 for the data lines is formed on the fourth edge $S_4$ side and the second edge $S_2$ side of the frame-shaped wiring region 6. The third inspection line 85 for the data lines is connected further with a third inspection pad 86 for the data lines. The third inspection pad 86 for the data lines is a pad through which a data inspection signal can be fed. Thus, a data inspection signal can be fed to the data lines $41_3$, $41_6$, $41_9$, ... $41_i$ via the third inspection pad 86 for the data lines.

In other words, in the frame-shaped wiring region 6, as described above, since the first inspection line 81 for the data lines, the first inspection pad 82 for the data lines, the second inspection line 83 for the data lines, the second inspection pad 84 for the data lines, the third inspection line 85 for the data lines, and the third inspection pad 86 for the data lines are formed, different data inspection signals can be fed to the adjacent data lines 41 and the adjacent third connection lines 79, respectively. Thereby any short circuit of the data lines 41 and the third connection lines 79 can be detected.

Further, in the frame-shaped wiring region 6, a switching element control line 87 is formed that is connected with the first switching elements 69, the second switching elements 74, and the third switching elements 80. The switching element control line 87 is provided closer to the display region 4 side, as compared with the first inspection line 81 for the data lines, the second inspection line 83 for the data lines, and the third inspection line 85 for the data lines. The switching element control line 87 is connected with a control pad 88. The control pad 88 is a pad through which a control signal for ON/OFF of the switching elements can be fed. Thus, a control signal can be fed to the first switching elements 69, the second switching elements 74, and the third switching elements 80 via the control pad 88.

Further, a common inspection line 89 is formed on the second edge $S_2$ side of the frame-shaped wiring region 6, and is connected with a common electrode pad 90. The common inspection line 89 is connected further with a transfer pad 91a. The transfer pad 91a is connected with a common electrode (not shown) formed on the counter substrate 3. Thereby the common electrode formed on the counter substrate 3 can be applied with a common voltage via the common electrode pad 90.

Hereinafter, a preferable arrangement relationship between the first inspection line 75 for the second connection lines, the second inspection line 77 for the second connection lines, the switching element control line 87, and the second switching elements 74 will be described in detail. Note here that a preferable arrangement relationship between the first inspection line 70 for the first connection lines, the second inspection line 72 for the first connection lines, the switching element control line 87, and the first switching elements 69 is the same as the aforementioned relationship, and therefore the detailed description thereof will be omitted.

That is, in a first layer, gate electrodes of the scanning lines 40 and the second switching elements 74 are formed in a monolayer or multilayer, using a metal or alloy such as Al, Ta, Ti, Cr, Cu or Mo (hereinafter, a line formed in the first layer is referred to as a "gate layer line"). In a second layer, source electrodes and drain electrodes of the data lines 41 and the second switching elements 74 are formed in a monolayer or multilayer, using a metal or alloy such as Al, Ta, Ti, Cr, Cu or Mo (hereinafter, a line formed in the second layer is referred to as a "source layer line"). Here, the gate layer line and the source layer line are spaced apart from each other via an insulation film. Further, since the scanning lines 40 are gate layer lines, it is necessary that the first inspection line 75 for the second connection lines, the second inspection line 77 for the second connection lines, and the switching element control line 87 be formed in a line layer that is different from the gate layer line. In other words, in order not to increase a step (process), an existing line layer preferably is used for the first inspection line 75 for the second connection lines, the second inspection line 77 for the second connection lines, and the switching element control line 87. Further, in order to reduce resistances of lines, they preferably are formed, not as a line layer for forming picture element electrodes, but as a source layer line.

With this line configuration, it is necessary that gate electrodes of the second switching elements 74 be connected with the switching element control line 87, which is a source layer line, and drain electrodes of the second switching elements 74 be connected with the scanning lines 40, which are gate layer lines. Thus, the number of connection parts between the gate layer lines and the source layer lines is increased.

Figure 3A:
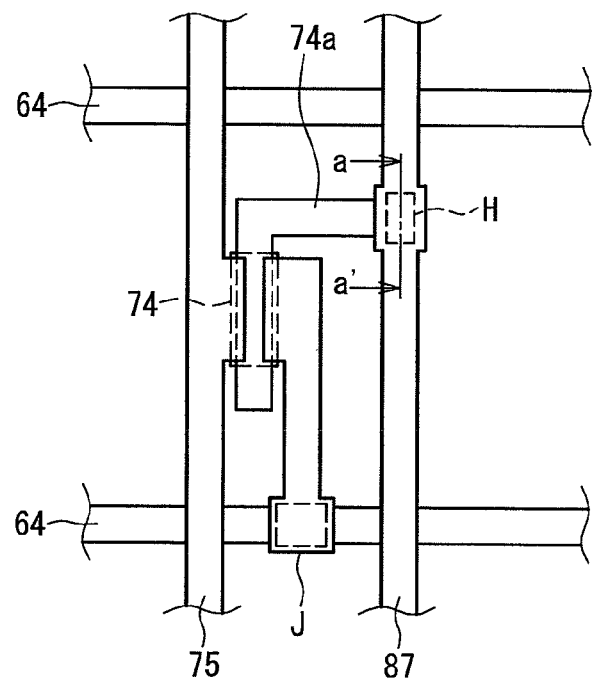
FIG. 3A shows a state in which a gate layer line and a source layer line are connected with each other.
Figure 3B:
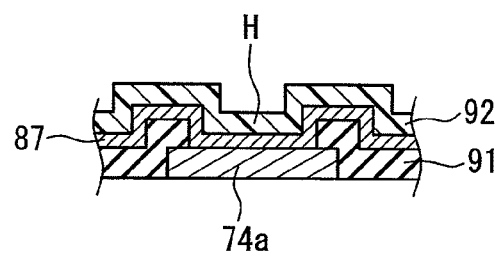
FIG. 3B is a cross-sectional view taken along a line a-a' in FIG. 3A.

As an exemplary connection configuration, first, as shown in FIGS. 3A and 3B, it is possible to consider a configuration in which an opening H is formed in an insulation film 91 that is placed between the gate layer line (a gate electrode 74a of the second switching element 74) and the source layer line (switching element control line 87) so that the gate layer line and the source layer line are directly in contact with each other. Here, in FIG. 3, 92 indicates a protective film and J indicates a connection part. FIG. 3A shows a state in which the gate layer line and source layer line are connected with each other. FIG. 3B is a cross-sectional view taken along a line a-a' in FIG. 3A.

Figure 4A:
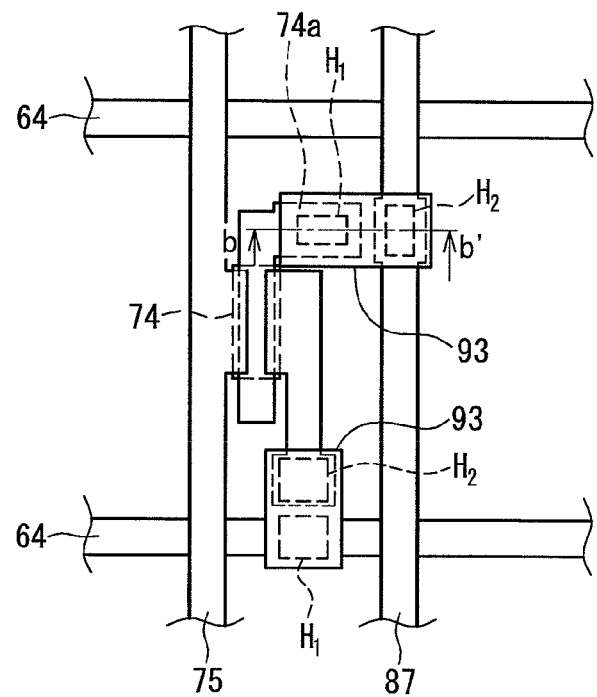
FIG. 4A shows a state in which the gate layer line and the source layer line are connected with each other.
Figure 4B:
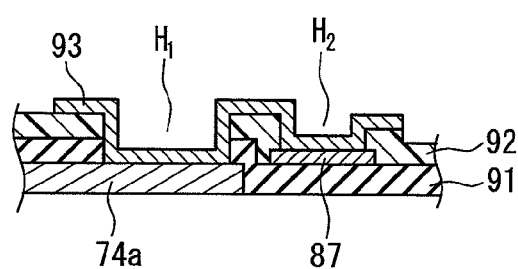
FIG. 4B is a cross-sectional view taken along a line b-b' in FIG. 4A.

Further, as another exemplary connection configuration, as shown in FIGS. 4A and 4B, it is possible to consider a configuration in which a first opening $H_1$ from which the gate layer line (the gate electrode 74a of the second switching element 74) is exposed is formed in the protective film 92 and the insulation film 91 that cover the gate layer line, and a second opening $H_2$ from which the source layer line (switching element control line 87) is exposed is formed in the protective film 92 that covers the source layer line, whereby the gate layer line and the source layer line come into contact with each other via an electrode pattern 93 formed on the protective film 92. Here, the electrode pattern 93, for example, is made from the same material as the picture element electrode. Incidentally, FIG. 4A shows a state in which the gate layer line and the source layer line are connected with each other. FIG. 4B is a cross-sectional view taken along a line b-b' in FIG. 4A.

Figure 5A:
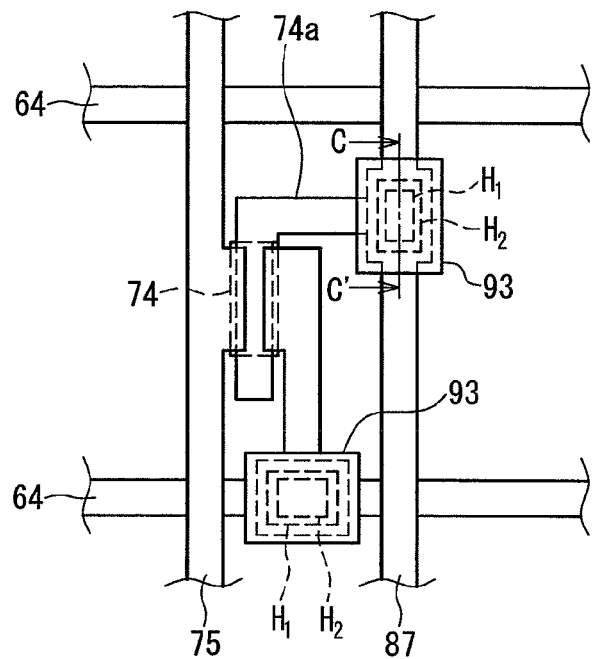
FIG. 5A shows a state in which the gate layer line and the source layer line are connected with each other.
Figure 5B:
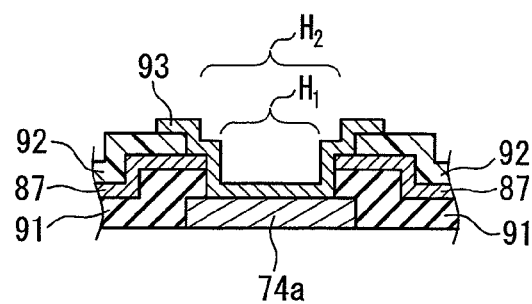
FIG. 5B is a cross-sectional view taken along a line c-c' in FIG. 5A.

Further, as another exemplary connection configuration, as shown in FIGS. 5A and 5B, it is possible to consider a configuration in which, in a section where the gate layer line (the gate electrode 74a of the second switching element 74) and the source layer line (switching element control line 87) overlap with each other when viewed in a plan view, a first opening $H_1$ is formed in the source layer line and the insulation film 91 so that a part of the gate layer line is exposed from the opening, and a second opening $H_2$ is formed in the protective film 92 so that a part of the source layer line is exposed from the opening, whereby electrode pattern 93 is formed to connect the source layer line with the gate layer line electrically. Here, the electrode pattern 93, for example, is made from the same material as the picture element electrode. Incidentally, FIG. 5A shows a state in which the gate layer line and the source layer line are connected with each other. FIG. 5B is a cross-sectional view taken along a line c-c' in FIG. 5A.

In each of the foregoing connection configurations, when the openings of the insulation films 91 and the protective films 92, or the electrode patterns 93 are not formed, or the sizes thereof are not appropriate due to the failure in the photolithography process or the like, problems such as no conductivity in lines or excessive resistance occur, which prevents a normal inspection of the scanning lines 40. Further, a space is required for forming such a connection configuration, which tends to cause leak between adjacent lines, or an outer dimension of the liquid crystal panel is required to be made large for securing an enough area for forming such a connection configuration. Therefore, preferably, the number of the connection parts J is as less as possible.

The following describes a configuration for reducing the number of the connection parts J between the gate layer line and the source layer line.

Figure 6:
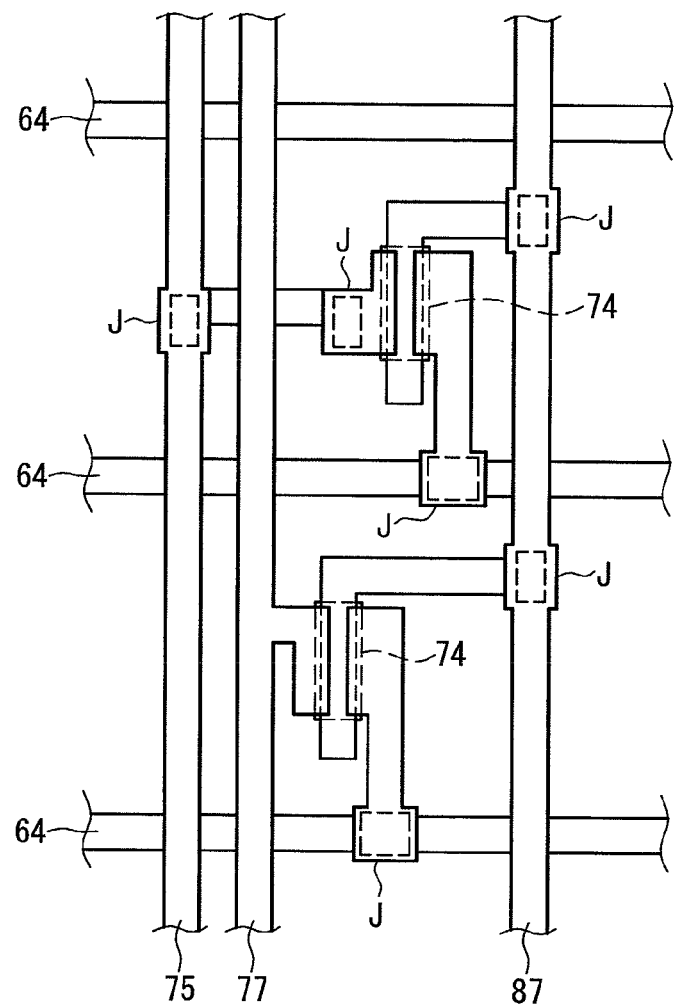
FIG. 6 illustrates an arrangement relationship between a first inspection line for second connection lines, a second inspection line for the second connection lines, and second switching elements.
Figure 7:
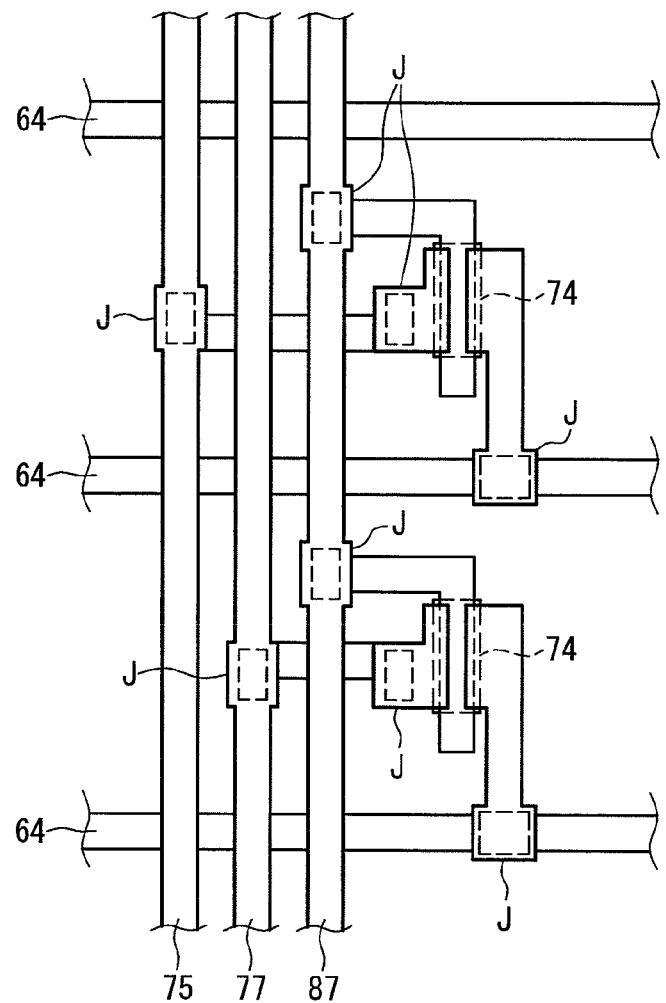
FIG. 7 illustrates the arrangement relationship between the first inspection line for the second connection lines, the second inspection line for the second connection lines, and the second switching elements.

FIGS. 6 and 7 show a configuration in which the first inspection line 75 for the second connection lines and the second inspection line 77 for the second connection lines are adjacent to each other, and the second switching elements 74 are not disposed therebetween. In this configuration, the source electrode of at least one of the second switching elements 74 is required to cross over the source layer lines, such as the switching element control line 87, the second inspection line 77 for the second connection lines (or the first inspection line 75 for the second connection lines), so as to be connected with the first inspection line 75 for the second connection lines (or the second inspection line 77 for the second connection lines). Accordingly, the source electrode of the second switching element 74 should once be switched to the gate layer line, which increases the number of the connection parts J.

For example, as shown in FIGS. 6 and 7, in the case where one second switching element 74 provided for the first inspection line 75 for the second connection lines and one second switching element 74 provided for the second inspection line 77 for the second connection lines are disposed, the number of the connection parts J becomes six in the configuration shown in FIG. 6, and becomes eight in the configuration shown in FIG. 7.

Figure 8:
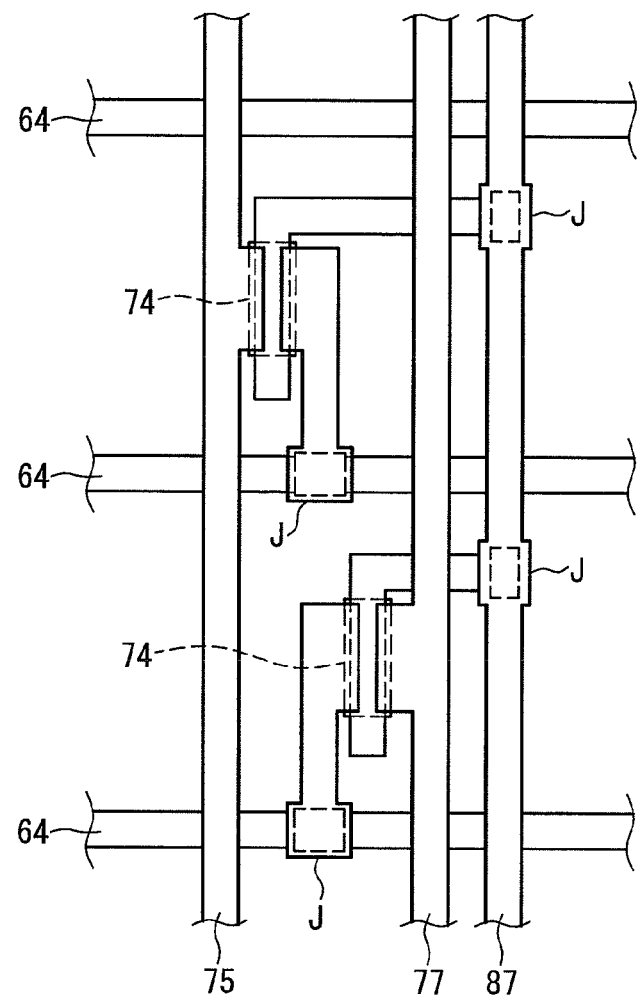
FIG. 8 illustrates the arrangement relationship between the first inspection line for the second connection lines, the second inspection line for the second connection lines, and the second switching elements.

FIG. 8 shows a configuration in which the first inspection line 75 for the second connection lines and the second inspection line 77 for the second connection lines are adjacent to each other, and the second switching elements 74 are disposed therebetween. In this configuration, it is not necessary that the source electrode of the second switching element 74 be switched to the gate layer line. Accordingly, as shown in FIG. 8, for example, in the case where one second switching element 74 provided for the first inspection line 75 for the second connection lines and one second switching element 74 provided for the second inspection line 77 for the second connection lines are disposed, the number of the connection parts J becomes 4, whereby two connection parts J are reduced as compared with the configurations of FIGS. 6 and 7. That is, as compared with the configurations of FIGS. 6 and 7, the configuration of FIG. 8 is expected to improve the yield, which contributes to the downsizing of the liquid crystal panel. Specifically in the configuration of the FIG. 8, the first inspection line 75 for the second connection lines, the second inspection line 77 for the second connection lines, and the second switching elements 74 are formed efficiently in the frame-shaped wiring region 6, whereby the liquid crystal panel can be downsized.

Figure 9:
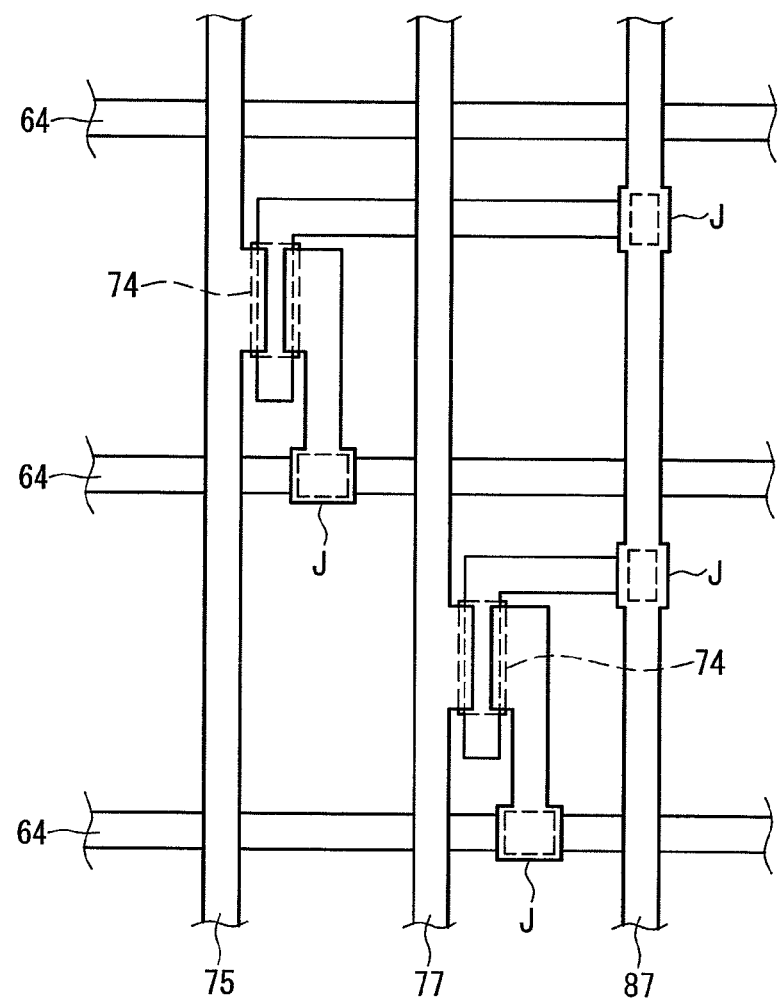
FIG. 9 illustrates the arrangement relationship between the first inspection line for the second connection lines, the second inspection line for the second connection lines, and the second switching elements.

Further, FIG. 9 shows a configuration in which the first inspection line 75 for the second connection lines and the second inspection line 77 for the second connection lines are adjacent to each other, and either one of the second switching element 74 provided for the first inspection line 75 for the second connection lines and the second switching element 74 provided for the second inspection line 77 for the second connection lines is disposed between the first inspection line 75 for the second connection lines and the second inspection line 77 for the second connection lines. In this configuration, likewise the configuration of FIG. 8, the number of the connection parts J is reduced to 4, whereby the configuration of FIG. 9 is expected to improve the yield, which contributes to the downsizing of the liquid crystal panel.

As described above, it is preferable to have a configuration in which the first inspection line 75 for the second connection lines and the second inspection line 77 for the second connection lines are adjacent to each other, and at least either one of the second switching element 74 provided for the first inspection line 75 for the second connection lines and the second switching element 74 provided for the second inspection line 77 for the second connection lines is disposed between the first inspection line 75 for the second connection lines and the second inspection line 77 for the second connection lines. This configuration makes it possible to suppress the occurrence of defects in manufacturing, thereby contributing to the downsizing of the liquid crystal panel.

Figure 10:
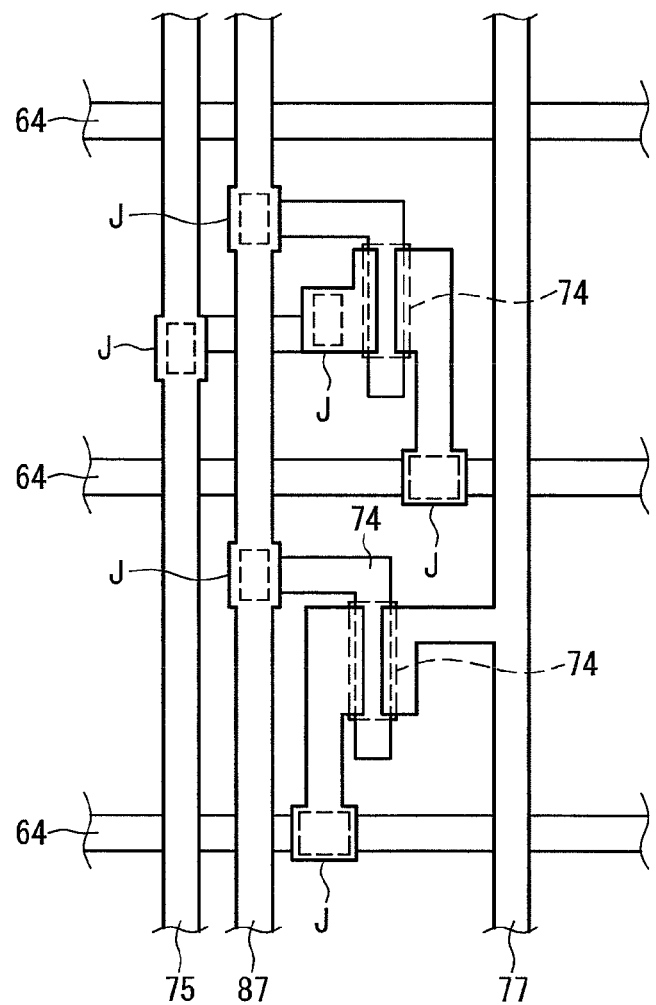
FIG. 10 illustrates the arrangement relationship between the first inspection line for the second connection lines, the second inspection line for the second connection lines, and the second switching elements.
Figure 11:
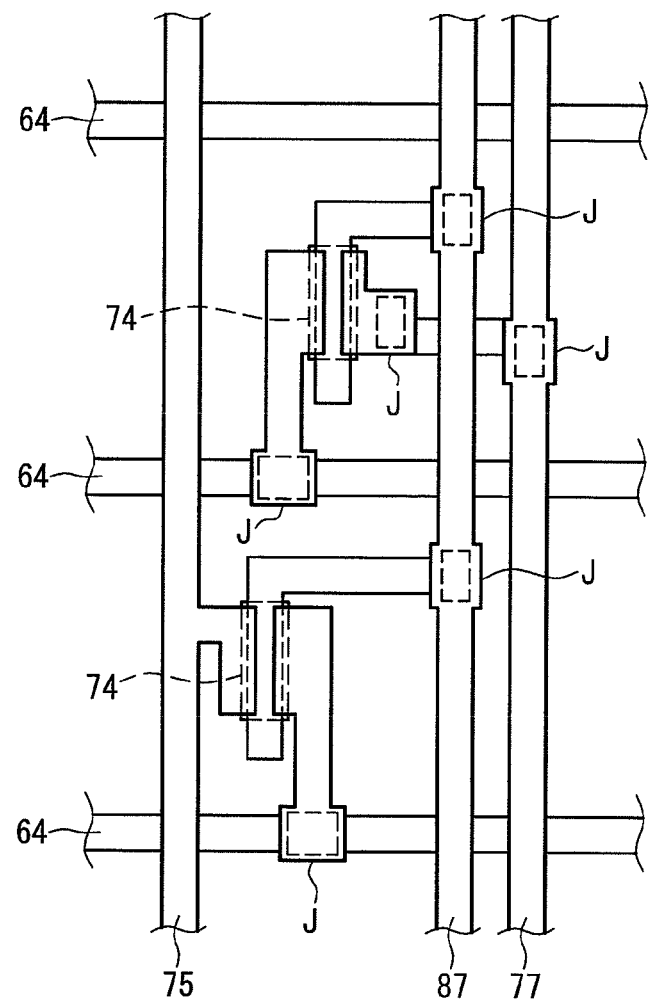
FIG. 11 illustrates the arrangement relationship between the first inspection line for the second connection lines, the second inspection line for the second connection lines, and the second switching elements.

FIGS. 10 and 11 show a configuration in which the switching element control line 87 is formed between the first inspection line 75 for the second connection lines and the second inspection line 77 for the second connection lines, and the second switching elements 74 are disposed on, with respect to the switching element control line 87, either the side of the first inspection line 75 for the second connection lines or the side of the second inspection line 77 for the second connection lines. In this configuration, the source electrode of at least one of the second switching elements 74 is required to cross over the switching element control line 87 that is the source layer line, so as to be connected with the first inspection line 75 for the second connection lines or the second inspection line 77 for the second connection lines. Accordingly, the source electrode of the second switching element 74 should once be switched to the gate layer line, which increases the number of the connection parts J. For example, as shown in FIGS. 10 and 11, in the case where one second switching element 74 provided for the first inspection line 75 for the second connection lines and one second switching element 74 provided for the second inspection line 77 for the second connection lines are disposed, the number of the connection parts J becomes six.

Figure 12:
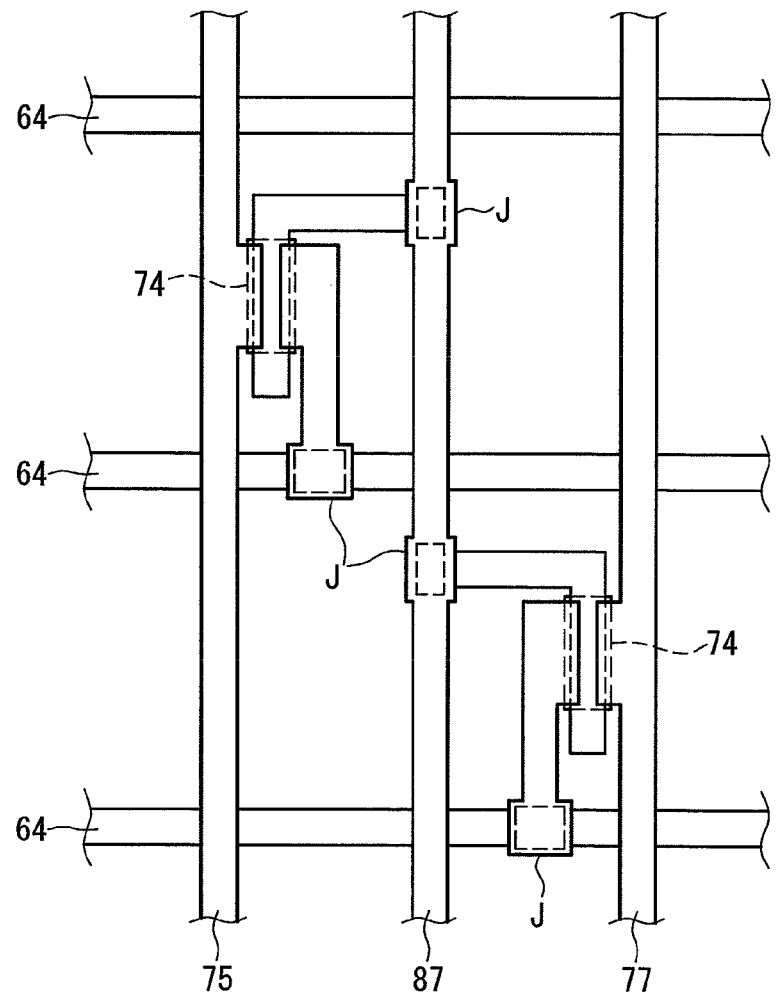
FIG. 12 illustrates the arrangement relationship between the first inspection line for the second connection lines, the second inspection line for the second connection lines, and the second switching elements.
Figure 13:
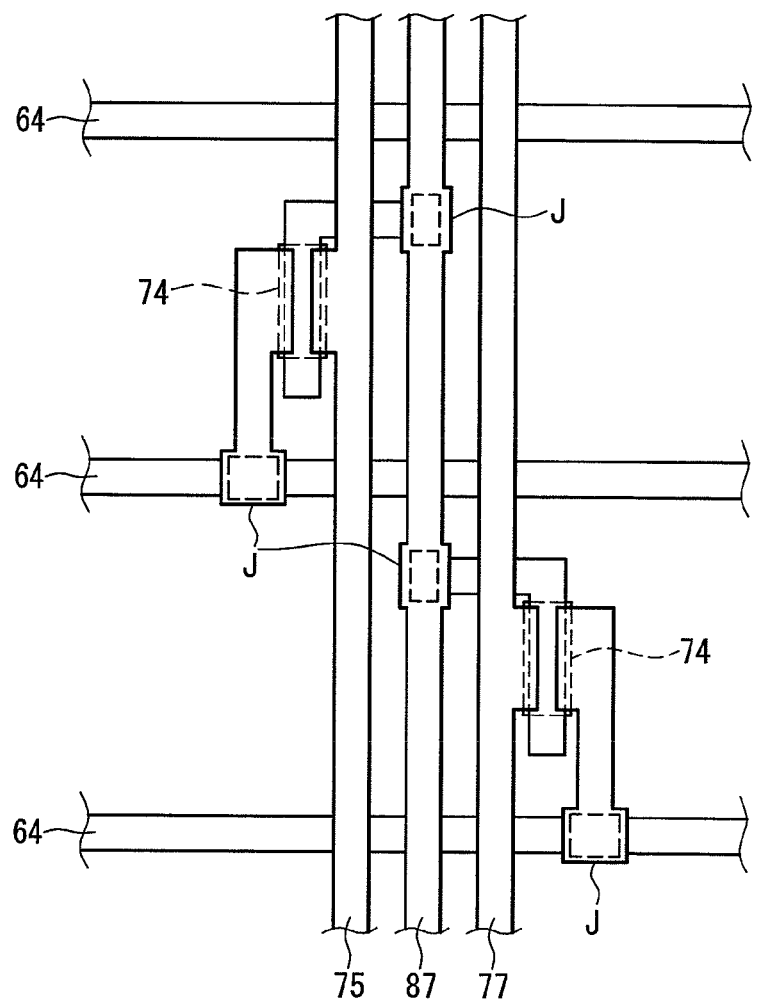
FIG. 13 illustrates the arrangement relationship between the first inspection line for the second connection lines, the second inspection line for the second connection lines, and the second switching elements.
Figure 14:
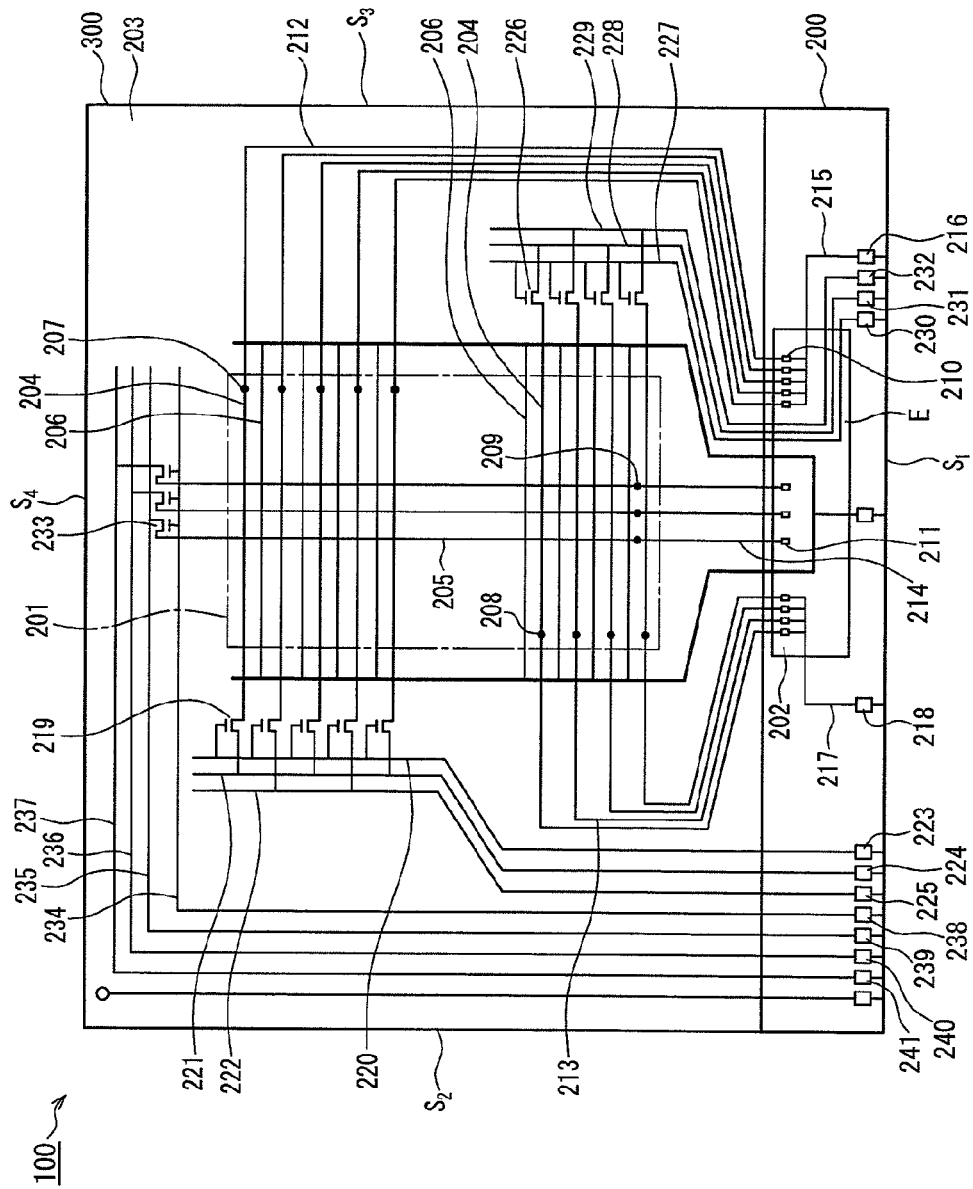
FIG. 14 is a plan view showing the schematic configuration of a conventional liquid crystal panel.
Figure 15:
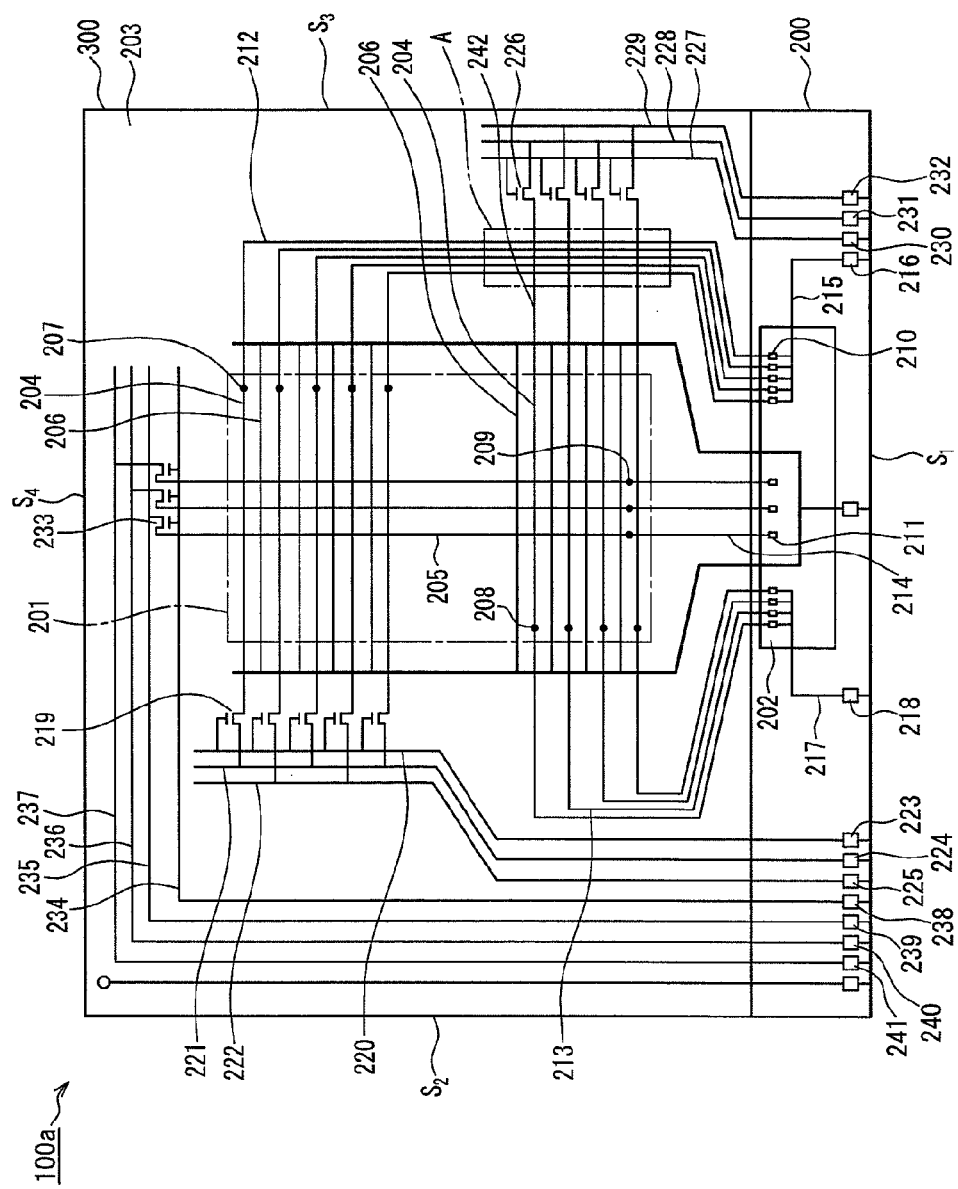
FIG. 15 is a plan view showing the schematic configuration of another conventional liquid crystal panel.
Figure 16:
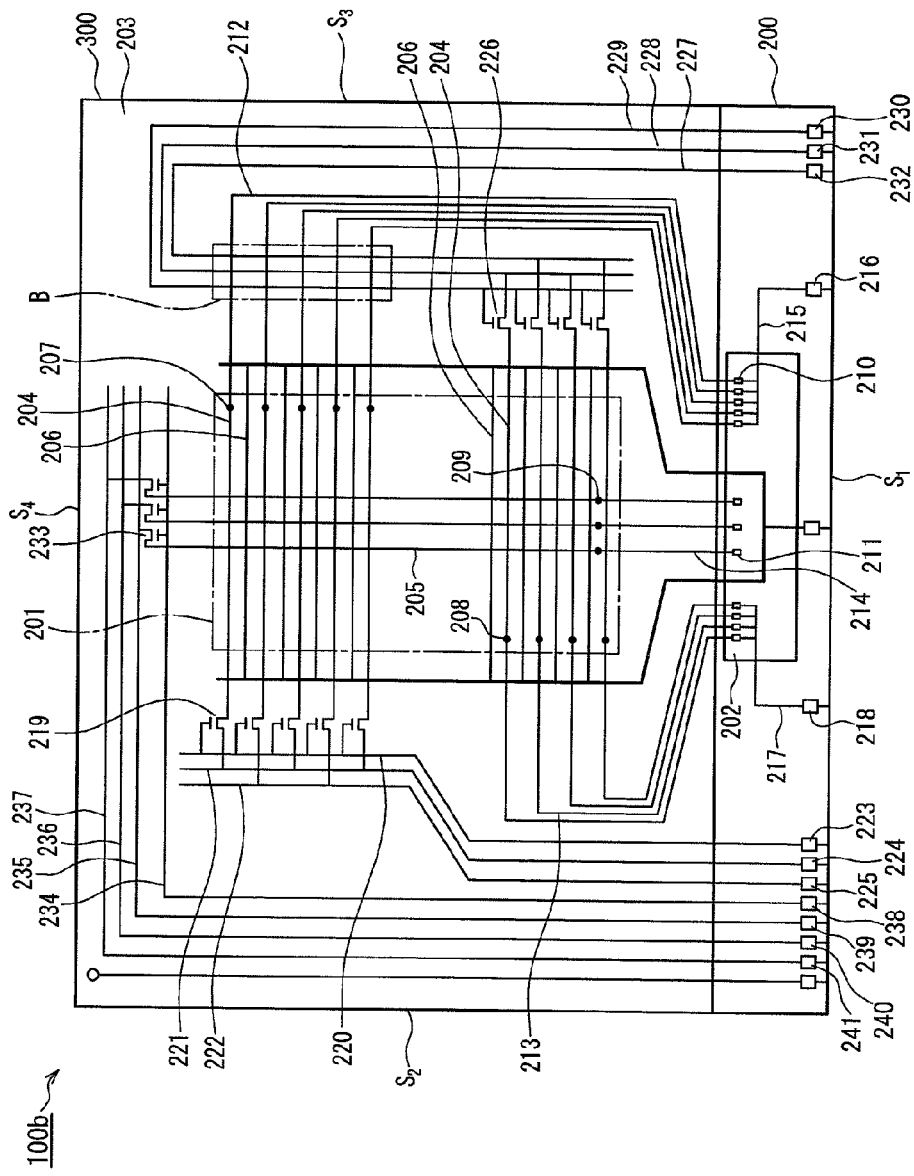
FIG. 16 is a plan view showing the schematic configuration of another conventional liquid crystal panel.

Meanwhile, FIGS. 12 and 13 show a configuration in which the switching element control line 87 is disposed between the first inspection line 75 for the second connection lines and the second inspection line 77 for the second connection lines, and the second switching elements 74 are disposed alternately on the side of the first inspection line 75 for the second connection lines and the side of the second inspection line 77 for the second connection lines with respect to the switching element control line 87. In this configuration, it is not necessary that the source electrode of the second switching element 74 be switched to the gate layer line. Accordingly, as shown in FIGS. 12 and 13, for example, in the case where one second switching element 74 provided for the first inspection line 75 for the second connection lines and one second switching element 74 provided for the second inspection line 77 for the second connection lines are disposed, the number of the connection parts J becomes 4, whereby two connection parts J are reduced as compared with the configurations of FIGS. 10 and 11. That is, as compared with the configurations of FIGS. 10 and 11, the configurations of FIGS. 12 and 13 are expected to improve the yield, which contribute to the downsizing of the liquid crystal panel.

As described above, it is preferable to have a configuration in which the switching element control line 87 is disposed between the first inspection line 75 for the second connection lines and the second inspection line 77 for the second connection lines, and the second switching elements 74 are disposed alternately on, with respect to the switching element control line 87, the side of first inspection line 75 for the second connection lines and the side of the second inspection line 77 for the second connection lines, respectively. This configuration makes it possible to suppress the occurrence of defects in manufacturing, thereby contributing to the downsizing of the liquid crystal panel.

Subsequently a method for manufacturing the liquid crystal panel 1 according to the present embodiment is described below. Note here that hereinafter particularly the inspection step for inspecting an electrical connection state of the liquid crystal panel 1 is described in detail.

Thin films such as a conductive film, an insulation film, a protective film, and an alignment film are laminated on a transparent glass substrate, whereby a base substrate for forming active matrix substrates, on which a plurality of active matrix substrate regions to be cut out as active matrix substrates 2 are formed. Further, thin films such as a black matrix, a color filter, a conductive film, and an alignment film are laminated on a transparent glass substrate, whereby a base substrate for forming counter substrates, on which a plurality of counter substrate regions to be cut out as counter substrates 3 are formed. Over one of the base substrates, a sealing agent is applied. Then, after the application of the sealing agent, the base substrates are aligned to each other. The aligned base substrates are cut into a mother substrate in which a predetermined number of liquid crystal panels 1 each of which has the active matrix substrate 2 and the counter substrate 3 are formed. Into each of the liquid crystal panels 1 cut out as the mother substrate, via filling ports formed between the active matrix substrate 2 and the counter substrate 3, a liquid crystal material is filled to therebetween, by, for example, the vacuum filling method. Note here that the liquid crystal material may be filled by the dropping filling method instead of the vacuum filling method. In this case, the filling ports and a step for sealing the filling ports are not required. Further, the liquid crystal panel 1 shown in FIG. 1 is one of liquid crystal panels 1 in the thus cut mother substrate after the liquid crystal material was filled therein. Therefore, liquid crystal panels are formed on, for example, upper, lower, left, and right sides to the liquid crystal panel 1 shown in FIG. 1, though they are not shown in the drawing.

Then, before a driver is mounted on the terminal arrangement region 5, an inspection step for inspecting an electrical connection state of the liquid crystal panel 1 is performed. That is, the inspection step is intended to perform inspection for disconnection or short circuit of lines and a defect in picture elements in the active matrix substrate 2 of the liquid crystal panel 1. Further, as will be described later in detail, the inspection step is performed through two inspection steps: a first inspection step and a second inspection step.

The following inspection method is performed. In the first inspection step, for example, an inspection probe is brought into contact with the inspection pad 63 for the first scanning lines, the inspection pad 66 for the second scanning lines, the inspection pad 68 for the storage capacity lines, the first inspection pad 82 for the data lines, the second inspection pad 84 for the data lines, the third inspection pad 86 for the data lines, the control pad 88, and the common electrode pad 90, so that a voltage is applied thereto. In the second inspection step, for example, an inspection probe is brought into contact with the inspection pad 68 for the storage capacity lines, the first inspection pad 71 for the first connection lines, the second inspection pad 73 for the first connection lines, the first inspection pad 76 for the second connection lines, the second inspection pad 78 for the second connection lines, the first inspection pad 82 for the data lines, the second inspection pad 84 for the data lines, the third inspection pad 86 for the data lines, the control pad 88, and the common electrode pad 90, so that a voltage is applied thereto. Note here that the order of bringing the inspection probe into contact with the pads are not specifically limited here.

Thus, a scanning inspection signal functioning as a scanning signal is fed to the scanning lines 40. Here, the scanning inspection signal, for example, is a signal for turning on switching elements of the respective picture elements for at least a predetermined period. Further, a data inspection signal functioning as a data signal is fed to the data lines 41. Here, the data inspection signal, for example, is a signal that allows liquid crystals in the respective picture element regions to be oriented in a desired direction. With this, the switching element of the respective picture elements are brought to an ON state; the orientation directions of liquid crystal molecules are controlled by the application of the data signal to the respective picture elements; and, for example, when the liquid crystal panel 1 is irradiated from the back side with an illumination means such as a backlight, the display screen of the liquid crystal panel 1 corresponding to the display region 4 of the active matrix substrate 2 (hereinafter, referred to as a "display screen of the liquid crystal panel 1") displays an image.

Therefore, disconnection/short circuit of lines in the active matrix substrate 2 of the liquid crystal panel 1 can be inspected by, for example, an inspector's visual observation, on the display screen of the liquid crystal panel 1. Note here that, instead of or in addition to the inspector's visual observation, an image recognition-processing device, or a detection device electrically detecting disconnection/short circuit of lines may be used for the inspection.

Here, the first inspection step is described below in detail.

The following describes the method for detecting disconnection of the scanning lines 40, the first connection lines 61, and the second connection lines 64.

A data inspection signal is fed to the data lines 41, and scanning inspection signals are fed to the scanning lines 40, the first connection lines 61, and the second connection lines 64 via the inspection pad 63 for the first scanning lines and the inspection pad 66 for the second scanning lines. With this, when there is disconnection in any of the scanning lines 40, in the display screen of the liquid crystal panel 1, picture elements ahead of the foregoing disconnection of the scanning line 40 are not displayed. Hence, the disconnection of the scanning line 40 can be detected by the inspector.

Further, when there is disconnection in any of the first connection lines 61, in the display screen of the liquid crystal panel 1, all the picture elements constituting one line corresponding to the first scanning lines $40_1, 40_3, 40_5, \ldots 40_m$ connected with the first connection line 61 having the disconnection are not displayed. Hence, the disconnection of the first connection line 61 can be detected by the inspector. Further, when there is disconnection in any of the second connection lines 64, in the display screen of the liquid crystal panel 1, all the picture elements constituting one line corresponding to the second scanning lines $40_2, 40_4, 40_6, \ldots 40_n$ connected with the second connection line 64 having the disconnection are not displayed. Hence, the disconnection of the second connection line 64 can be detected by the inspector.

Next, a method for detecting short circuit of the scanning lines 40 and the storage capacity lines 42 is described.

A scanning inspection signal is fed to the storage capacity lines 42 via the inspection pad 68 for the storage capacity lines, without feeding a signal to the scanning lines 40. At this time, when there is short circuit between any of the storage capacity lines 42 and the scanning lines 40, the scanning inspection signal is fed to the scanning line 40 from the portion having the short circuit, whereby only the storage capacity lines 42 and the scanning line 40 having the short circuit are displayed irregularly. Hence, the short circuit between the scanning line 40 and the storage capacity line 42 can be detected by the inspector.

Incidentally, in the above, scanning inspection signals are collectively fed to the first connection lines 61 via the inspection pad 63 for the first scanning lines. That is, the same scanning inspection signal is fed to each of the adjacent first connection lines 61. In other words, the adjacent first connection lines 61 have the same potential. Further, scanning inspection signals are collectively fed to the second connection lines 64 via the inspection pad 66 for the second scanning lines. That is, the same scanning inspection signal is fed to each of the adjacent second connection lines 64. In other words, the adjacent second connection lines 64 have the same potential.

Consequently, since scanning inspection signals are collectively fed to the first connection lines 61 via the inspection pad 63 for the first scanning lines, and also scanning inspection signals are collectively fed to the second connection lines 64 via the inspection pad 66 for the second scanning lines, any short circuit between the first connection lines 61 and between the second connection lines 64 cannot be detected in the first inspection step. Therefore, the presence/absence of short circuits in the first connection lines 61 and the second connection lines 64 is inspected in the second inspection step, which will be described later.

Next, a method for detecting disconnection of the data lines 41 is described.

Scanning inspection signals are fed to the scanning lines 40, and data inspection signals are fed to the data lines 41 via the first inspection pad 82 for the data lines, the second inspection pad 84 for the data lines, and the third inspection pad 86 for the data lines. With this, when there is disconnection in any of the data lines 41, in the display screen of the liquid crystal panel 1, picture elements ahead of the foregoing disconnection of the data line 41 are displayed differently to picture elements in normal lines. Hence, the disconnection of the data lines 41 can be detected by the inspector.

Next, a method for detecting short circuit of the data lines 41 and the third connection lines is described.

A control signal for turning on the third switching elements 80 is fed to the third switching elements 80 via the control pad 88, whereby the third switching elements 80 are turned on. Here, for example, a data inspection signal is fed only to the data lines $41_1, 41_4, 41_7, \ldots 41_{i-2}$ among the plurality of the data lines 41, and the signal is not fed to the other data lines, i.e., $41_2, 41_3, 41_5, \ldots 41_{i-1}, 41_i$. For example, the inspection probe is brought into contact only with the first inspection pad 82 for the data lines, and the probe is not in contact with the second inspection pad 84 for the data lines and the third inspection pad 86 for the data lines.

With this, when there is short circuit of the data lines $41_1$, $41_4, 41_7, \ldots 41_{i-2}$, not only the picture elements constituting the lines corresponding to the data lines $41_1, 41_4, 41_7, \ldots 41_{i-2}$, but also the picture elements constituting the lines corresponding to the data lines $41_2, 41_3, 41_5, \ldots 41_{i-1}, 41_i$ having the short circuit are displayed. Hence, the short circuit of the data lines $41_1, 41_4, 41_7, \ldots 41_{i-2}$ can be detected by the inspector. Further, when there is short circuit of the third connection lines $79_1, 79_4, 79_7, \ldots 79_{i-2}$, not only the picture elements constituting the lines corresponding to the data lines $41_1, 41_4, 41_7, \ldots 41_{i-2}$ connected with the third connection lines $79_1, 79_4, 79_7, \ldots 79_{i-2}$, but also the picture elements constituting the lines corresponding to the data lines $41_2, 41_3$, $41_5, \ldots 41_{i-1}, 41_i$ connected with the third connection lines $79_2, 79_3, 79_5, \ldots 79_{i-1}, 79_i$ having the short circuit are displayed. Hence, the short circuit of the third connection lines $79_1, 79_4, 79_7, \ldots 79_{i-2}$ can be detected by the inspector.

Similarly, when the inspection probe is brought into contact only with the second inspection pad 84 for the data lines, and the probe is not in contact with the first inspection pad 82 for the data lines and the third inspection pad 86 for the data lines, short circuit of the data lines $41_2, 41_5, 41_8, \ldots 41_{i-1}$ and the third connection lines $79_2, 79_5, 79_8, \ldots 79_{i-1}$ can be detected by the inspector. Further, when the inspection probe is brought into contact only with the third inspection pad 86 for the data lines, and the probe is not in contact with the first inspection pad 82 for the data lines and the second inspection pad 84 for the data lines, short circuit of the data lines $41_3$, $41_6, 41_9, \ldots 41_i$ and the third connection lines $79_3, 79_6$, $79_9, \ldots 79_i$ can be detected by the inspector.

As described above, in the first inspection step, it is impossible to detect short circuit of the first connection lines 61 and the second connection lines 64. Therefore, in order to inspect the presence/absence of short circuit of the first connection lines 61 and the second connection lines 64, the second inspection step is preformed subsequently.

Here, prior to the second inspection step, a step of cutting the first extension lines 53 and the second extension lines 54 is performed. Specifically, the first extension lines 53 and the second extension lines 54 are cut, for example, along a cutting line C shown in FIG. 1. As a cutting method, for example, a laser is used. This allows the scanning terminals 51 connected with the first connection lines 61 to be cut from one another electrically. Further, the scanning terminals 51 connected with the second connection lines 64 are cut from one another electrically. Note here that the cutting may be carried out along any other cutting line, instead of the cutting line C, as long as the plurality of scanning terminals 51 are cut from one another electrically.

Next, the second inspection step is described in detail.

The following describes a method for detecting short circuit of the first connection lines 61 and the second connection lines 64. Note here that a method for detecting short circuit of the scanning lines 40 and the storage capacity lines 42, a method for detecting disconnection of the data lines 41, and a method for detecting short circuit of the data lines 41 and the third connection lines are the same as the methods described in the first inspection step, and therefore, detailed explanations thereof are omitted. Further, a method for detecting disconnection of the scanning lines 40 can be performed in the same manner as the method in the first inspection step by using the first inspection pad 71 for the first connection lines, the second inspection pad 73 for the first connection lines, the first inspection pad 76 for the second connection lines, and the second inspection pad 78 for the second connection lines, instead of using the inspection pad 63 for the first scanning lines and the inspection pad 66 for the second scanning lines in the first inspection step.

A control signal for turning on the first switching elements 69 is fed to the first switching elements 69 via the control pad 88, whereby the first switching elements 69 are turned on. Here, a scanning inspection signal is fed only to the first connection lines $61_1$, $61_5$, $61_9$, ... $61_{m-1}$ among the plurality of the first connection lines 61, and the signal is not fed to the other first connection lines, i.e., $61_3$, $61_7$, $61_{11}$, ... $61_m$. For example, the inspection probe is brought into contact only with the first inspection pad 71 for the first connection lines, and the probe is not in contact with the second inspection pad 73 for the first connection lines.

With this, when there is short circuit of the first connection lines $61_1$, $61_5$, $61_9$, ... $61_{m-1}$, not only the picture elements constituting the lines corresponding to the first scanning lines $40_1$, $40_5$, $40_9$, ... $40_{m-1}$ connected with the first connection lines $61_1$, $61_5$, $61_9$, ... $61_{m-1}$, but also the picture elements constituting the lines corresponding to the first scanning lines $40_3$, $40_7$, $40_{11}$, ... $40_m$ connected with the first connection lines $61_3$, $61_7$, $61_{11}$, ... $61_m$ having the short circuit are displayed. Hence, the short circuit of the first connection lines $61_1$, $61_5$, $61_9$, ... $61_{m-1}$ can be detected by the inspector.

Similarly, for example, when the inspection probe is brought into contact only with the second inspection pad 73 for the first connection lines, and the probe is not in contact with the first inspection pad 71 for the first connection lines, short circuit of the first connection lines $61_3$, $61_7$, $61_{11}$, ... $61_m$ can be detected by the inspector.

A control signal for turning on the second switching elements 74 is fed to the second switching elements 74 via the control pad 88, whereby the second switching elements 74 are turned on. Here, a scanning inspection signal is fed only to the second connection lines $64_2$, $64_6$, $64_{10}$, ... $64_{n-1}$ among the plurality of the second connection lines 64, and the signal is not fed to the other second connection lines, i.e., $64_4$, $64_8$, $64_{12}$, ... $64_n$. For example, the inspection probe is brought into contact only with the first inspection pad 76 for the second connection lines, and the probe is not in contact with the second inspection pad 78 for the second connection lines.

With this, when there is short circuit of the second connection lines $64_2$, $64_6$, $64_{10}$, ... $64_{n-1}$, not only the picture elements constituting the lines corresponding to the second scanning lines $40_2$, $40_6$, $40_{10}$, ... $40_{n-1}$ connected with the second connection lines $64_2$, $64_6$, $64_{10}$, ... $64_{n-1}$, but also the picture elements constituting the lines corresponding to the second scanning lines $40_4$, $40_8$, $40_{12}$, ... $40_n$ connected with the second connection lines $64_4$, $64_8$, $64_{12}$, ... $64_n$ having the short circuit are displayed. Hence, the short circuit of the second connection lines $64_2$, $64_6$, $64_{10}$, ... $64_{n-1}$ can be detected by the inspector.

Similarly, for example, when the inspection probe is brought into contact only with the second inspection pad 78 for the second connection lines, and the probe is not in contact with the first inspection pad 76 for the second connection lines, short circuit of the second connection lines $64_4$, $64_8$, $64_{12}$ ..., $64_n$ can be detected by the inspector.

Incidentally, in the aforementioned cutting step, when the first extension lines 53 and the second extension lines 54 are cut, part of the first extension lines 53 and the second extension lines 54 remains without being removed in some cases. Further, cuttings flying over the terminal arrangement region 5 could cause short circuit to the scanning terminals 51 and the extension lines 53, 54 in some cases. Therefore, it is preferable to inspect whether the scanning terminals 51 connected with the first connection lines 61 and the second connection lines 64 are cut electrically from one another. That is, scanning inspection signals are fed to the first connection lines 61 and the second connection lines 64 via the inspection pad 63 for the first scanning lines and the inspection pad 66 for the second scanning lines. Therefore, if part of the first extension lines 53 and the second extension lines 54 remains without being removed or there is short circuit between the scanning terminals 51 and the extension lines 53, 54, an image will be displayed on the display screen of the liquid crystal panel 1. Thus, troubles occurring in the cutting step can be detected.

In the first inspection step or the second inspection step, when disconnection or short circuit of lines is detected, the liquid crystal panel 1 in which such disconnection or short circuit is detected is removed as a defective item. This eliminates the chances of mounting drivers to detective liquid crystal panels 1, thereby improving the yield in a driver-mounting step and achieving cost reduction. Note here that a liquid crystal panel 1 in which disconnection or short circuit is detected may not be removed, but the disconnection or the short circuit may be repaired by irradiating the portion of the disconnection or the short circuit with laser or the like.

Then, after the aforementioned inspection steps (the first and the second inspection steps), the mounting step is performed. The mounting step is intended to mount a driver for driving and controlling the scanning lines 40 and the data lines 41 in, for example, the terminal arrangement region 5 of the active matrix substrate 2. Then, individual liquid crystal panels 1 are cut out of the mother substrate. Onto the liquid crystal panel 1 thus cut out, an optical film such as a polarizing plate is applied. Thereby the liquid crystal panel 1 is manufactured. Note here that the method for manufacturing the liquid crystal panel 1 is not limited to the aforementioned method. For example, a color filter does not have to be provided on a counter substrate in the case where a monochrome liquid crystal panel is manufactured. The inspection step and the mounting step may be performed after the individual liquid crystal panels are cut out.

As described above, according to the active matrix substrate 2 of the present embodiment, the first inspection line 70 for the first connection lines and the second inspection line 72 for the first connection lines cross each of the plurality of first connection lines 61. Further, the first inspection line 75 for the second connection lines and the second inspection line 77 for the second connection lines cross each of the plurality of second connection lines 64. Thus, since both the plurality of first connection lines 61 and the plurality of second connection lines 64 cross the same number of the inspection lines, a load applied to the first connection lines 61 and a load applied to the second connection lines 64 are equal. Thereby a potential to be achieved by the first scanning lines $40_1$, $40_3$, $40_5$, ... $40_m$ connected with the first connection lines 61 and a potential to be achieved by the second scanning lines $40_2$, $40_4$, $40_6$, ... $40_n$ connected with the second connection lines 64 will be the same. Because of this, when the active matrix substrate 2 according to the present embodiment is mounted to a display device, an image with uniform brightness can be displayed on the display screen of the display device. Further, the aforementioned inspection lines 70, 72, 75, and 77 are formed in the frame-shaped wiring region 6, excluding the terminal arrangement region 5 and the display region 4. Consequently, it is possible to realize the active matrix substrate 2 capable of improving a display quality, without forming inspection lines for inspecting short circuits between connection lines in the terminal arrangement region.

Note here that the above description of the present embodiment explains an example in which a common electrode is formed on the counter substrate and a common voltage is applied to the common electrode of the counter substrate, but the present invention is not limited to this. For example, needless to say, the present invention is applicable to a liquid crystal panel of an IPS (In Plane Switching) mode in which a common electrode is formed on an active matrix substrate. Here, transfer pads are not necessarily formed on the active matrix substrate of the liquid crystal panel of the IPS mode. Furthermore, needless to say, the present invention is applicable to a liquid crystal panel of a MVA (Multi-domain Vertical Aligned) mode, a liquid crystal panel of an OCB (Optically Compensated Bend) mode, and the like.

The above description of the present embodiment explains an example of a CsonCommon-type liquid crystal panel in which independent storage capacity lines are formed in the display region and storage capacitors are formed utilizing the storage capacity lines, but the present invention is not limited to this. In other words, needless to say, the present invention is applicable to a CsonGate-type liquid crystal panel in which storage capacitors are formed utilizing adjacent scanning lines. Here, in the CsonGate-type liquid crystal panel, it is unnecessary to form independent storage capacity lines in the display region, whereby a high aperture ratio can be realized.

The above description of the present embodiment explains an example in which a common switching element control line for the first switching elements, the second switching elements, and the third switching elements is formed in the frame-shaped wiring region, but the present invention is not limited to this. For example, switching element control lines may be provided individually for the first switching elements, the second switching elements, and the third switching elements in the frame-shaped wiring region.

Further, the above description of the present embodiment explains an example in which each inspection pad formed on an active matrix substrate is not connected with each inspection pad formed on another active matrix substrate, but the present invention is not limited to this. In other words, each inspection pad formed on the active matrix substrate may be connected with each inspection pad formed on another active matrix substrate. Especially, if an inspection pad for the first scanning lines and an inspection pad for the second scanning lines are connected with an inspection pad formed on another active matrix substrate, static electricity generated on the active matrix substrate can be removed and dispersed effectively.

Further, the above description of the present embodiment explains an example in which each inspection pad is formed on an active matrix substrate, but the present invention is not limited to this. For example, each inspection pad may be formed on a substrate different from the active matrix substrate, and only lines for inspection to which an inspection signal supplied from each inspection pad can be fed may be formed on the active matrix substrate.

The present invention is not limited to the embodiment described above, and may be varied in many ways in the scope indicated by claims. In other words, embodiments obtained by combining technical means appropriately modified in the scope indicated by claims also fall in the technical scope of the present invention.

INDUSTRIAL APPLICABILITY

As described above, the present invention is useful as an active matrix substrate, a display device, a method for inspecting an active matrix substrate, and a method for inspecting a display device that are capable of improving a display quality without forming inspection lines for inspecting short circuits between connection lines in a terminal arrangement region.

The invention claimed is:
1. An active matrix substrate, comprising:
a plurality of scanning lines formed parallel with one another in a display region;
a plurality of data lines formed parallel with one another so as to cross the plurality of scanning lines in the display region; and
a plurality of scanning terminals and a plurality of data terminals arranged in a terminal arrangement region,
wherein the plurality of scanning lines include a plurality of first scanning lines having input ends for a scanning signal on one end side and a plurality of second scanning lines having input ends for a scanning signal on the other end side, and the first scanning lines and the second scanning lines are formed so as to alternate with one another one by one in the display region,
the active matrix substrate further comprising:
a plurality of first connection lines connecting the input ends of the first scanning lines for a scanning signal with the scanning terminals;
a plurality of second connection lines connecting the input ends of the second scanning lines for a scanning signal with the scanning terminals;
a plurality of third connection lines connecting input ends of the data lines for a data signal with the data terminals;
a plurality of first switching elements connected respectively with the plurality of first connection lines;
a first inspection line crossing each of the plurality of first connection lines through which an inspection signal can be fed to the first switching elements that are not adjacent to one another, among the plurality of first switching elements;
a second inspection line crossing each of the plurality of first connection lines through which an inspection signal can be fed to the first switching elements that are not connected with the first inspection line and are not adjacent to one another, among the plurality of first switching elements;

a first control line crossing each of the plurality of first connection lines through which a control signal configured to control ON/OFF of the plurality of first switching elements can be fed;

a plurality of second switching elements connected respectively with the plurality of second connection lines;

a third inspection line crossing each of the plurality of second connection lines through which an inspection signal can be fed to the second switching elements that are not adjacent to one another, among the plurality of second switching elements;

a fourth inspection line crossing each of the plurality of second connection lines through which an inspection signal can be fed to the second switching elements that are not connected with the third inspection line and are not adjacent to one another, among the plurality of second switching elements; and a second control line crossing each of the plurality of second connection lines through which a control signal configured to control ON/OFF of the plurality of second switching elements can be fed;

wherein the first inspection line, the second inspection line, the third inspection line, and the fourth inspection line are formed in a frame-shaped wiring region, excluding the terminal arrangement region and the display region;

wherein each of the plurality of first switching elements is arranged adjacent to one of the first inspection line and the second inspection line which is connected to the first switching element concerned without being intervened therebetween by the first control line or the other of the first inspection line and the second inspection line which is not connected to the first switching element concerned; and wherein each of the plurality of second switching elements is arranged adjacent to one of the third inspection line and the forth inspection line which is connected to the second switching element concerned without being intervened therebetween by the second control line or the other of the third inspection line and the forth inspection line which is not connected to the second switching element concerned.

2. The active matrix substrate according to claim 1, wherein the plurality of first switching elements are formed in the frame-shaped wiring region so as to be close to the input ends of the first scanning lines for a scanning signal, and the plurality of second switching elements are formed in the frame-shaped wiring region so as to be close to the input ends of the second scanning lines for a scanning signal.

3. The active matrix substrate according to claim 1, wherein the first inspection line and the second inspection line are adjacent to each other, the third inspection line and the fourth inspection line are adjacent to each other, at least one of the plurality of first switching elements is arranged between the first inspection line and the second inspection line, and at least one of the plurality of second switching elements is arranged between the third inspection line and the fourth inspection line.

4. The active matrix substrate according to claim 3, wherein all of the plurality of first switching elements are arranged between the first inspection line and the second inspection line, and all of the plurality of second switching elements are arranged between the third inspection line and the fourth inspection line.

5. The active matrix substrate according to claim 1, wherein the plurality of first switching elements are arranged on both sides with respect to the first control line, and the plurality of second switching elements are arranged on both sides with respect to the second control line.

6. The active matrix substrate according to claim 5, wherein the first switching elements are arranged alternately on the right and the left sides with respect to the first control line, and the second switching elements are arranged alternately on the right and the left sides with respect to the second control line.

7. The active matrix substrate according to claim 1, wherein the data lines have input ends for a data signal on one end side, the active matrix substrate further comprising:

a plurality of third switching elements connected with the other end side of the data lines;

a seventh inspection line through which an inspection signal can be fed to the third switching elements that are not adjacent to one another, among the plurality of third switching elements; and an eighth inspection line through which an inspection signal can be fed to the third switching elements that are not connected with the seventh inspection line and are not adjacent to one another, among the plurality of third switching elements.

8. A display device comprising the active matrix substrate according to claim 1.

9. The display device according to claim 8, wherein the display device is a liquid crystal display device.

10. A method for inspecting the active matrix substrate according to claim 1 or a display device including the active matrix substrate according to claim 1, comprising the steps of:

inspecting the first connection lines by feeding inspection signals independent from each other to the first inspection line and the second inspection line, respectively, while maintaining the first switching elements in an ON state; and inspecting the second connection lines by feeding inspection signals independent from each other to the third inspection line and the fourth inspection line, respectively, while maintaining the second switching elements in an ON state.

11. A method for inspecting the active matrix substrate according to claim 7 or a display device including the active matrix substrate according to claim 7, comprising the steps of:

inspecting the first scanning lines by feeding an inspection signal thereto from the fifth inspection line;

inspecting the second scanning lines by feeding an inspection signal thereto from the sixth inspection line;

inspecting the data lines by feeding inspection signals independent from each other to the seventh inspection line and the eighth inspection line, respectively, while maintaining the third switching elements in an ON state;

cutting the plurality of first extension lines and the plurality of second extension lines;

inspecting the first connection lines by feeding inspection signals independent from each other to the first inspection line and the second inspection line, respectively, while maintaining the first switching elements in an ON state; and inspecting the second connection lines by feeding inspection signals independent from each other to the third inspection line and the fourth inspection line, respectively, while maintaining the second switching elements in an ON state.

12. An active matrix substrate, comprising:

a plurality of scanning lines formed parallel with one another in a display region;

a plurality of data lines formed parallel with one another so as to cross the plurality of scanning lines in the display region; and a plurality of scanning terminals and a plurality of data terminals arranged in a terminal arrangement region, wherein the plurality of scanning lines include a plurality of first scanning lines having input ends for a scanning signal on one end side and a plurality of second scanning lines having input ends for a scanning signal on the other end side, and the first scanning lines and the second scanning lines are formed so as to alternate with one another one by one in the display region, the active matrix substrate further comprising:

a plurality of first connection lines connecting the input ends of the first scanning lines for a scanning signal with the scanning terminals;

a plurality of second connection lines connecting the input ends of the second scanning lines for a scanning signal with the scanning terminals;

a plurality of third connection lines connecting input ends of the data lines for a data signal with the data terminals;

a plurality of first switching elements connected respectively with the plurality of first connection lines;

a first inspection line crossing each of the plurality of first connection lines through which an inspection signal can be fed to the first switching elements that are not adjacent to one another, among the plurality of first switching elements;

a second inspection line crossing each of the plurality of first connection lines through which an inspection signal can be fed to the first switching elements that are not connected with the first inspection line and are not adjacent to one another, among the plurality of first switching elements;

a plurality of second switching elements connected respectively with the plurality of second connection lines;

a third inspection line crossing each of the plurality of second connection lines through which an inspection signal can be fed to the second switching elements that are not adjacent to one another, among the plurality of second switching elements;

a fourth inspection line crossing each of the plurality of second connection lines through which an inspection signal can be fed to the second switching elements that are not connected with the third inspection line and are not adjacent to one another, among the plurality of second switching elements;

a plurality of first extension lines extended individually from the plurality of scanning terminals connected respectively with the plurality of first connection lines, wherein each of the plurality of first extension lines has a cut portion;

a fifth inspection line connected with each of the plurality of first extension lines;

a plurality of second extension lines extended individually from the plurality of scanning terminals connected respectively with the plurality of second connection lines, wherein each of the plurality of second extension lines has a cut portion; and a sixth inspection line connected with each of the plurality of second extension lines, wherein the first inspection line, the second inspection line, the third inspection line, and the fourth inspection line are formed in a frame-shaped wiring region, excluding the terminal arrangement region and the display region.

13. The active matrix substrate according to claim 12, wherein the plurality of first switching elements are formed in the frame-shaped wiring region so as to be close to the input ends of the first scanning lines for a scanning signal, and the plurality of second switching elements are formed in the frame-shaped wiring region so as to be close to the input ends of the second scanning lines for a scanning signal.

14. The active matrix substrate according to claim 12, wherein the first inspection line and the second inspection line are adjacent to each other, the third inspection line and the fourth inspection line are adjacent to each other, at least one of the plurality of first switching elements is arranged between the first inspection line and the second inspection line, and at least one of the plurality of second switching elements is arranged between the third inspection line and the fourth inspection line.

15. The active matrix substrate according to claim 14, wherein all of the plurality of first switching elements are arranged between the first inspection line and the second inspection line, and all of the plurality of second switching elements are arranged between the third inspection line and the fourth inspection line.

16. The active matrix substrate according to claim 12, further comprising:

a first control line through which a control signal for controlling ON/OFF of the plurality of first switching elements can be fed is formed between the first inspection line and the second inspection line; and a second control line through which a control signal for controlling ON/OFF of the plurality of second switching elements can be fed is formed between the third inspection line and the fourth inspection line, wherein the plurality of first switching elements are arranged on both sides with respect to the first control line and the plurality of second switching elements are arranged on both sides with respect to the second control line.

17. The active matrix substrate according to claim 16, wherein the plurality of first switching elements are arranged alternately on the right and the left sides with respect to the first control line, and the plurality of second switching elements are arranged alternately on the right and the left sides with respect to the second control line.

18. The active matrix substrate according to claim 12, wherein the data lines have input ends for a data signal on one end side, the active matrix substrate further comprising:
- a plurality of third switching elements connected with the other end side of the data lines;
- a seventh inspection line through which an inspection signal can be fed to the third switching elements that are not adjacent to one another, among the plurality of third switching elements; and
- an eighth inspection line through which an inspection signal can be fed to the third switching elements that are not connected with the seventh inspection line and are not adjacent to one another, among the plurality of third switching elements.

19. A display device comprising the active matrix substrate according to claim 12.

20. The display device according to claim 1, wherein the first control line and the second control line are electrically connected to each other.

* * * * *